(12) United States Patent
Chen et al.

(10) Patent No.: US 10,879,109 B2
(45) Date of Patent: Dec. 29, 2020

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Xi-Zong Chen, Tainan (TW); Chih-Hsuan Lin, Hsinchu (TW); Cha-Hsin Chao, Taipei (TW); Yi-Wei Chiu, Kaohsiung (TW); Li-Te Hsu, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/852,984

(22) Filed: Apr. 20, 2020

(65) Prior Publication Data
US 2020/0251382 A1   Aug. 6, 2020

Related U.S. Application Data

(62) Division of application No. 16/104,377, filed on Aug. 17, 2018, now Pat. No. 10,629,480.

(60) Provisional application No. 62/590,787, filed on Nov. 27, 2017.

(51) Int. Cl.
| *H01L 21/768* | (2006.01) |
| *H01L 21/311* | (2006.01) |
| *H01L 23/522* | (2006.01) |
| *H01L 23/528* | (2006.01) |

(52) U.S. Cl.
CPC .. *H01L 21/76816* (2013.01); *H01L 21/31116* (2013.01); *H01L 21/31138* (2013.01); *H01L 21/76831* (2013.01); *H01L 21/76844* (2013.01); *H01L 23/5226* (2013.01); *H01L 23/5283* (2013.01); *H01L 21/76804* (2013.01)

(58) Field of Classification Search
CPC ......... H01L 21/76816; H01L 21/76804; H01L 21/76831; H01L 23/5283; H01L 23/5226
See application file for complete search history.

(56) References Cited

U.S. PATENT DOCUMENTS

| 6,025,276 A | 2/2000 | Donohoe et al. |
| 6,887,785 B1 | 5/2005 | Dobuzinsky et al. |
| 2005/0106887 A1 | 5/2005 | Chen et al. |
| 2013/0005147 A1 | 1/2013 | Angyal et al. |
| 2018/0374744 A1 | 12/2018 | Wu et al. |
| 2019/0096751 A1 | 3/2019 | Sato et al. |
| 2020/0126914 A1* | 4/2020 | Chang ............... H01L 21/76885 |

* cited by examiner

*Primary Examiner* — Joseph C. Nicely
(74) *Attorney, Agent, or Firm* — Birch, Stewart, Kolasch & Birch, LLP

(57) ABSTRACT

A method for forming a semiconductor device structure is provided. The method includes forming a recess in a layer. The recess has two opposite first inner walls and two opposite second inner walls, the first inner walls are spaced apart by a first distance, the second inner walls are spaced apart by a second distance, and the first distance is less than the second distance. The method includes depositing a first covering layer in the recess. The first covering layer covering the first inner walls is thinner than the first covering layer covering the second inner walls. The method includes removing the first covering layer over the first inner walls and a bottom surface of the recess.

20 Claims, 41 Drawing Sheets

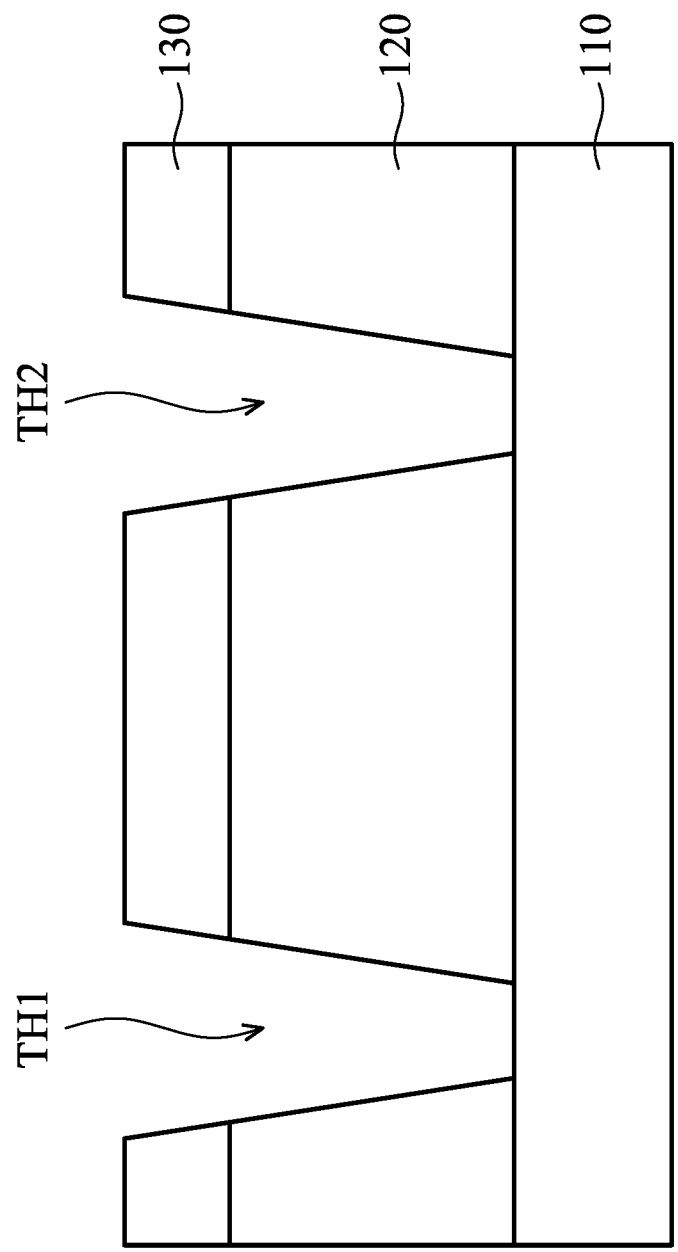

METHOD FOR FORMING SEMICONDUCTOR DEVICE STRUCTURE

PRIORITY CLAIM AND CROSS-REFERENCE

This application is a Divisional of U.S. application Ser. No. 16/104,377, filed on Aug. 17, 2018, the entirety of which is incorporated by reference herein. This application claims the benefit of U.S. Provisional Application No. 62/590,787, filed on Nov. 27, 2017, and entitled "METHOD FOR FORMING SEMICONDUCTOR DEVICE STRUCTURE", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform and the critical dimension uniformity of components (or lines) continues to become more difficult to control. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1H are cross-sectional views of various stages of a process for forming a semiconductor device structure, in accordance with some embodiments.

FIGS. 3A-1 to 3G-1 are cross-sectional views illustrating the semiconductor device structure along a sectional line I-I' in FIGS. 3A-3G, in accordance with some embodiments.

FIGS. 3A-2 to 3G-2 are cross-sectional views illustrating the semiconductor device structure along a sectional line II-II' in FIGS. 3A-3G, in accordance with some embodiments.

DETAILED DESCRIPTION

Figure 1A:
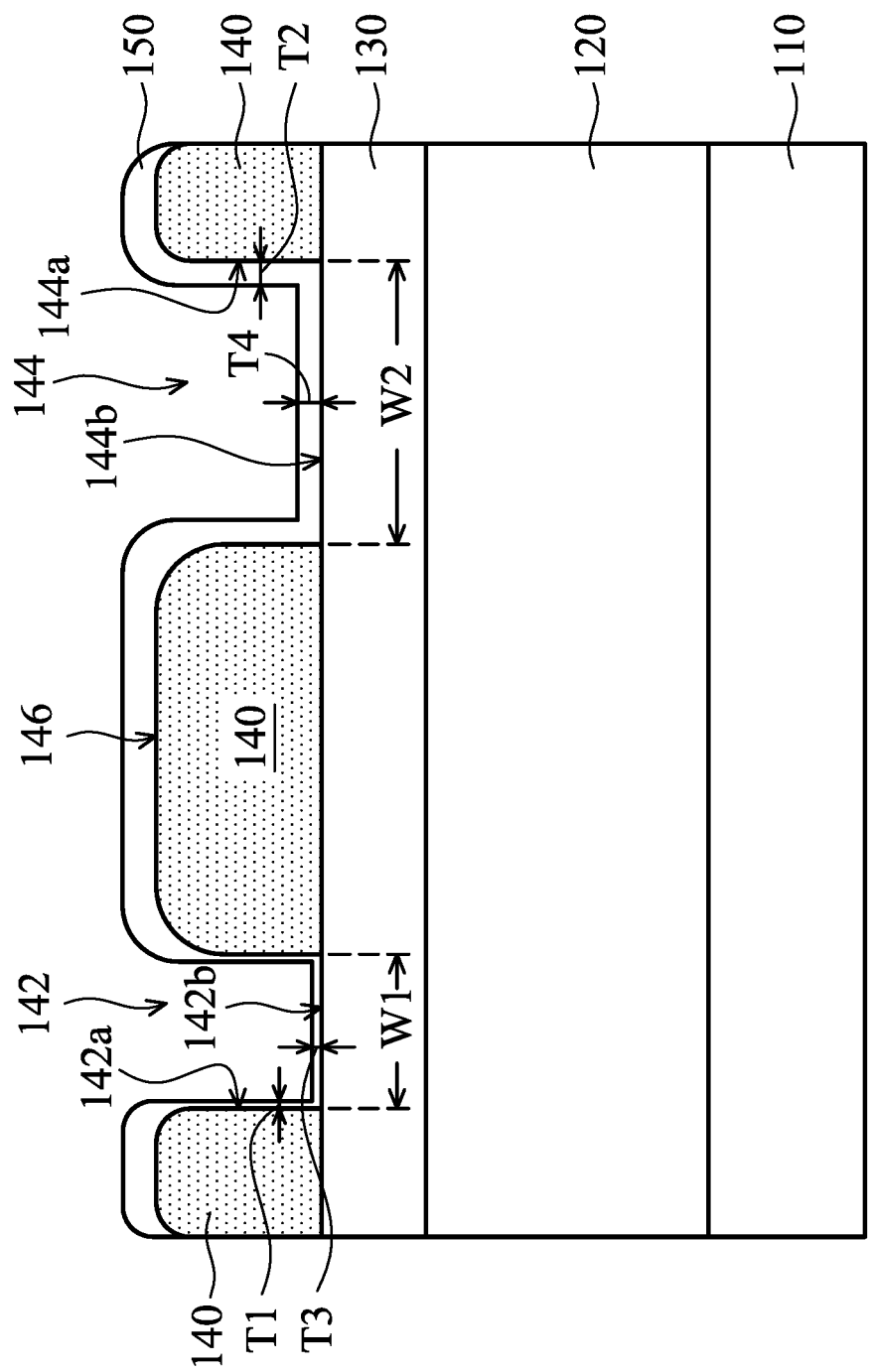

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1H are cross-sectional views of various stages of a process for forming a semiconductor device structure, in accordance with some embodiments. As shown in FIG. 1A, a layer 110 is provided, in accordance with some embodiments. The layer 110 may be a single-layer structure or a multi-layer structure, in accordance with some embodiments.

The layer 110 is made of an insulating material, in accordance with some embodiments. The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

In some other embodiments, the layer 110 is made of a conductive material, in accordance with some embodiments. The conductive material includes metal, such as copper, aluminum, tungsten, gold, silver, or a combination thereof, in accordance with some embodiments.

In some embodiments, the layer 110 is a substrate. The layer 110 is a bulk semiconductor substrate, such as a semiconductor wafer. For example, the layer 110 is a silicon wafer. The layer 110 may include silicon or another elementary semiconductor material such as germanium. In some other embodiments, the layer 110 includes a compound semiconductor. The compound semiconductor may include silicon germanium, gallium arsenide, silicon carbide, indium arsenide, indium phosphide, another suitable compound semiconductor, or a combination thereof.

In some embodiments, the layer 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the layer 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the layer 110. The isolation features are used to define active regions and electrically isolate various device elements formed in and/or over the layer 110 in the active regions. In some embodiments, the isolation features include shallow trench isolation (STI) features, local oxidation of silicon (LOCOS) features, other suitable isolation features, or a combination thereof.

As shown in FIG. 1A, a mask layer 120 is formed over the layer 110, in accordance with some embodiments. The layer 110 and the mask layer 120 are made of different materials, in accordance with some embodiments. The mask layer 120 is made of a polymer material, in accordance with some embodiments. As shown in FIG. 1A, an antireflection layer 130 is formed over the mask layer 120, in accordance with some embodiments. The antireflection layer 130 is also referred to as an antireflection coating layer (ARC layer), in accordance with some embodiments. The antireflection layer 130 is a silicon-containing layer, in accordance with some embodiments. The antireflection layer 130 is made of silicon oxide or another suitable material.

As shown in FIG. 1A, a mask layer 140 is formed over the antireflection layer 130, in accordance with some embodiments. The mask layer 140 is made of a polymer material, such as a photoresist material, in accordance with some embodiments. As shown in FIG. 1A, recesses 142 and 144 are formed in the mask layer 140, in accordance with some embodiments. The recess 142 is narrower than the recess 144, in accordance with some embodiments. That is, a width W1 of the recess 142 is less than a width W2 of the recess 144, in accordance with some embodiments. The recesses 142 and 144 respectively expose portions of the antireflection layer 130, in accordance with some embodiments.

As shown in FIG. 1A, a covering layer 150 is deposited over the mask layer 140 and is deposited in the recesses 142 and 144, in accordance with some embodiments. The covering layer 150 conformally covers inner walls 142a and 144a and bottom surfaces 142b and 144b of the recesses 142 and 144 and a top surface 146 of the mask layer 140, in accordance with some embodiments.

The deposition process of the covering layer 150 uses a vapor deposition material, in accordance with some embodiments. The vapor deposition material is more easily deposited into a wide recess than a narrow recess, in accordance with some embodiments. Therefore, the covering layer 150 in the (narrower) recess 142 is thinner than the covering layer 150 in the (wider) recess 144, in accordance with some embodiments.

The thickness T1 of the covering layer 150 covering the inner walls 142a is less than the thickness T2 of the covering layer 150 covering the inner walls 144a, in accordance with some embodiments. The thickness T3 of the covering layer 150 covering the bottom surface 142b is less than the thickness T4 of the covering layer 150 covering the bottom surface 144b, in accordance with some embodiments.

The vapor deposition material is more easily deposited outside of the recesses 142 and 144 than in the recesses 142 and 144, in accordance with some embodiments. Therefore, the covering layer 150 over the top surface 146 of the mask layer 140 is thicker than the covering layer 150 over the bottom surfaces 142b and 144b of the recesses 142 and 144, in accordance with some embodiments.

The covering layer 150 is made of a polymer material, oxides (e.g., silicon oxides), nitride, or another suitable material, in accordance with some embodiments. In some embodiments, the covering layer 150 and the mask layer 140 are made of different materials. In some other embodiments, the covering layer 150 and the mask layer 140 are made of the same material.

The covering layer 150 is formed using a physical vapor deposition process, in accordance with some embodiments. The physical vapor deposition process includes a plasma deposition process, in accordance with some embodiments. A deposition gas used by the plasma deposition process includes $CHF_3$, $C_4F_6$, or another suitable gas, in accordance with some embodiments. The plasma deposition process is performed at a pressure ranging from about 60 mT to about 200 mT, in accordance with some embodiments.

Figure 1B:
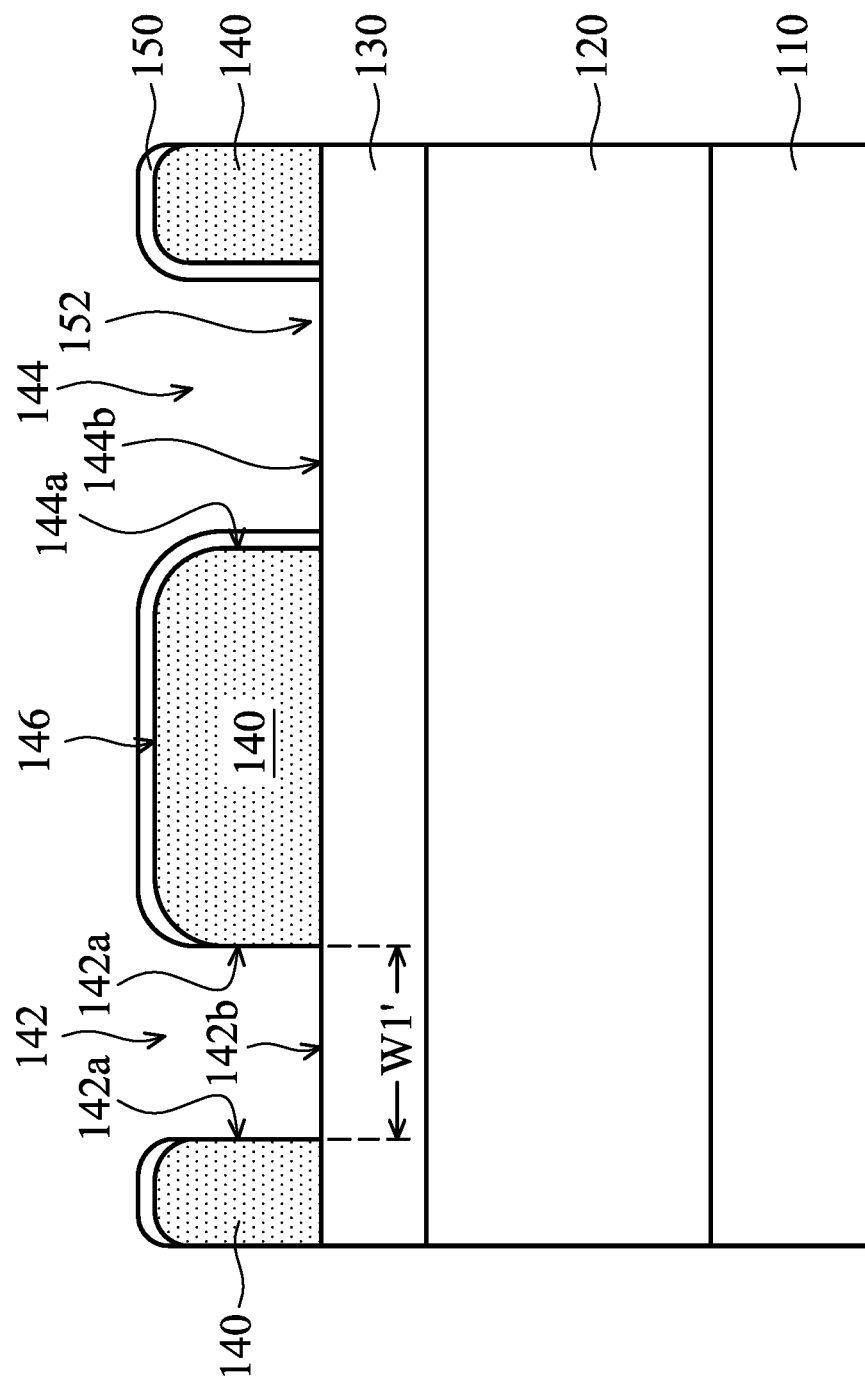

As shown in FIG. 1B, the covering layer 150 is thinned, in accordance with some embodiments. The covering layer 150 is thinned using an etching process, in accordance with some embodiments. The etching process is also referred to as a trimming process, in accordance with some embodiments. The etching process includes an anisotropic etching process, in accordance with some embodiments. In the etching process, the etching rate of the covering layer 150 over the substantially horizontal surfaces (e.g., the top surface 146 and the bottom surfaces 142b and 144b) is greater than the etching rate of the covering layer 150 over the substantially vertical surfaces (e.g., the inner walls 142a and 144a), in accordance with some embodiments. Therefore, the covering layer 150 covering the bottom surfaces 142b and 144b is removed, in accordance with some embodiments.

The removal of the covering layer 150 covering the bottom surface 144b forms an opening 152 in the covering layer 150, in accordance with some embodiments. The opening 152 partially exposes the antireflection layer 130, in accordance with some embodiments.

Since the covering layer 150 over the inner walls 142a is thinner than the covering layer 150 over the inner walls 144a (as shown in FIG. 1A), the covering layer 150 over the inner walls 142a is removed after the etching process (as shown in FIG. 1B), in accordance with some embodiments. After the covering layer 150 over the inner walls 142a is removed, a portion of the mask layer 140 is removed from the inner walls 142a by the etching process to widen the recess 142, in accordance with some embodiments. As shown in FIG. 1B, the recess 142 has a width W1', which is greater than the width W1 of the recess 142 of FIG. 1A, in accordance with some embodiments.

The anisotropic etching process includes a dry etching process (e.g., a plasma etching process), in accordance with some embodiments. The plasma etching process uses a process gas including an oxygen gas and a nitrogen gas, in accordance with some embodiments. The volume ratio of the oxygen gas to the nitrogen gas ranges from about 2 to about 5, in accordance with some embodiments. The process frequency of the plasma etching process ranges from about 5 MHz to about 40 MHz, in accordance with some embodiments. The process power of the plasma etching process ranges from about 50 W to about 150 W, in accordance with some embodiments.

In some embodiments, the covering layer 150 is formed using a plasma deposition process and the covering layer 150 is thinned using a plasma etching process. The covering layer 150 is formed and thinned in the same plasma chamber, in accordance with some embodiments.

Figure 1C:
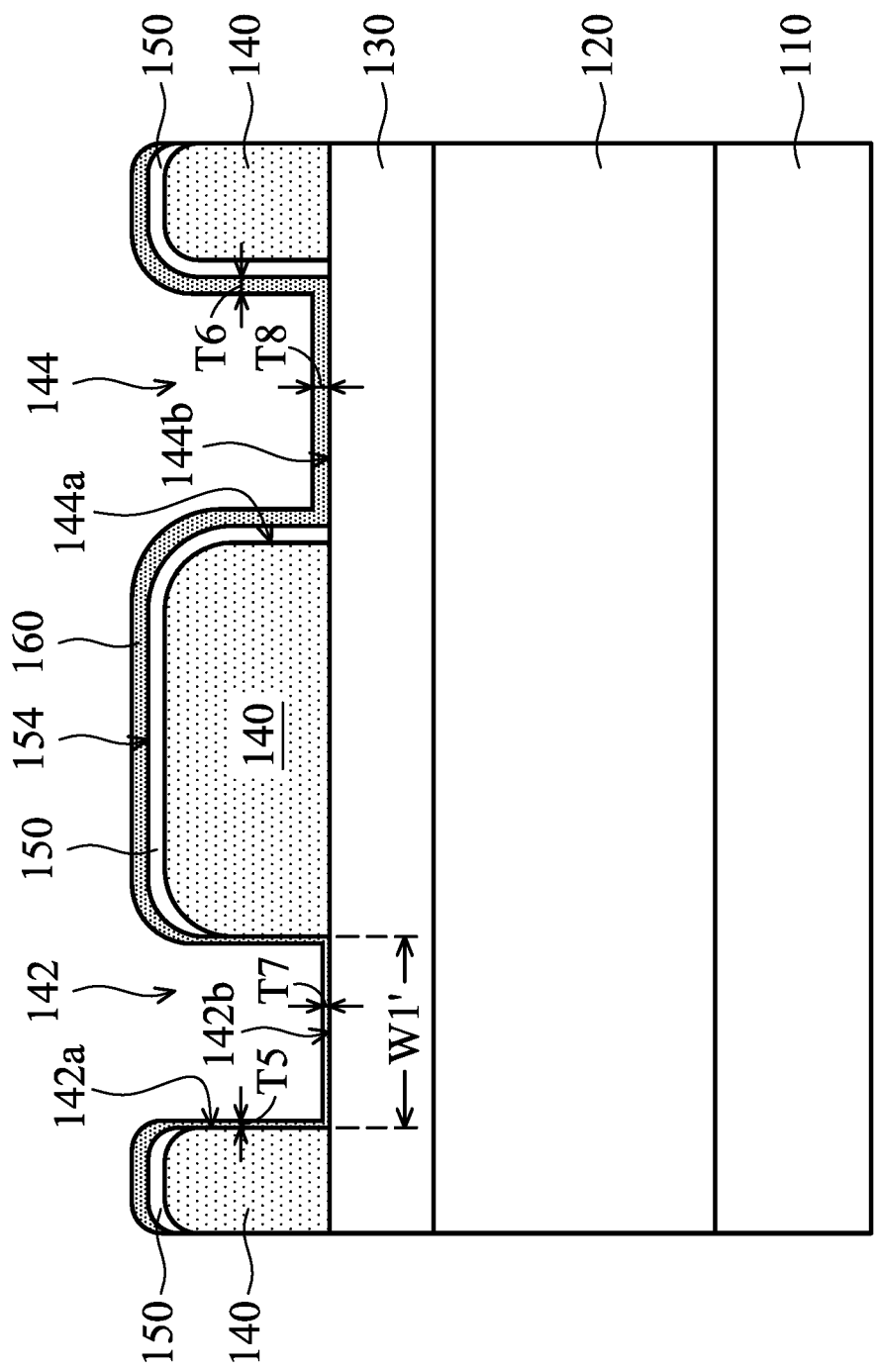

As shown in FIG. 1C, a covering layer 160 is deposited over the mask layer 150 and is deposited in the recesses 142 and 144, in accordance with some embodiments. The covering layer 160 in the recess 142 is thinner than the covering layer 160 in the recess 144, in accordance with some embodiments. The covering layer 160 conformally covers the inner walls 142a and the bottom surfaces 142b and 144b of the recesses 142 and 144 and the covering layer 150, in accordance with some embodiments.

The thickness T5 of the covering layer 160 covering the inner walls 142a is less than the thickness T6 of the covering layer 160 covering the inner walls 144a, in accordance with some embodiments. The thickness T7 of the covering layer 160 covering the bottom surface 142b is less than the thickness T8 of the covering layer 160 covering the bottom surface 144b, in accordance with some embodiments.

The covering layer 160 is made of a polymer material, oxides (e.g., silicon oxides), nitride, or another suitable material, in accordance with some embodiments. In some embodiments, the covering layer 160 and the mask layer 140 are made of different materials. In some other embodiments, the covering layer 160 and the mask layer 140 are made of the same material. In some embodiments, the covering layers 150 and 160 are made of the same material. In some other embodiments, the covering layers 150 and 160 are made of different materials.

The covering layer 160 is formed using a physical vapor deposition process or a chemical vapor deposition process, in accordance with some embodiments. The physical vapor deposition process includes a plasma deposition process, in accordance with some embodiments. A deposition gas used by the plasma deposition process includes $CHF_3$, $C_4F_6$, or another suitable gas, in accordance with some embodiments. The plasma deposition process is performed at a pressure ranging from about 60 mT to about 200 mT, in accordance with some embodiments.

Figure 1D:
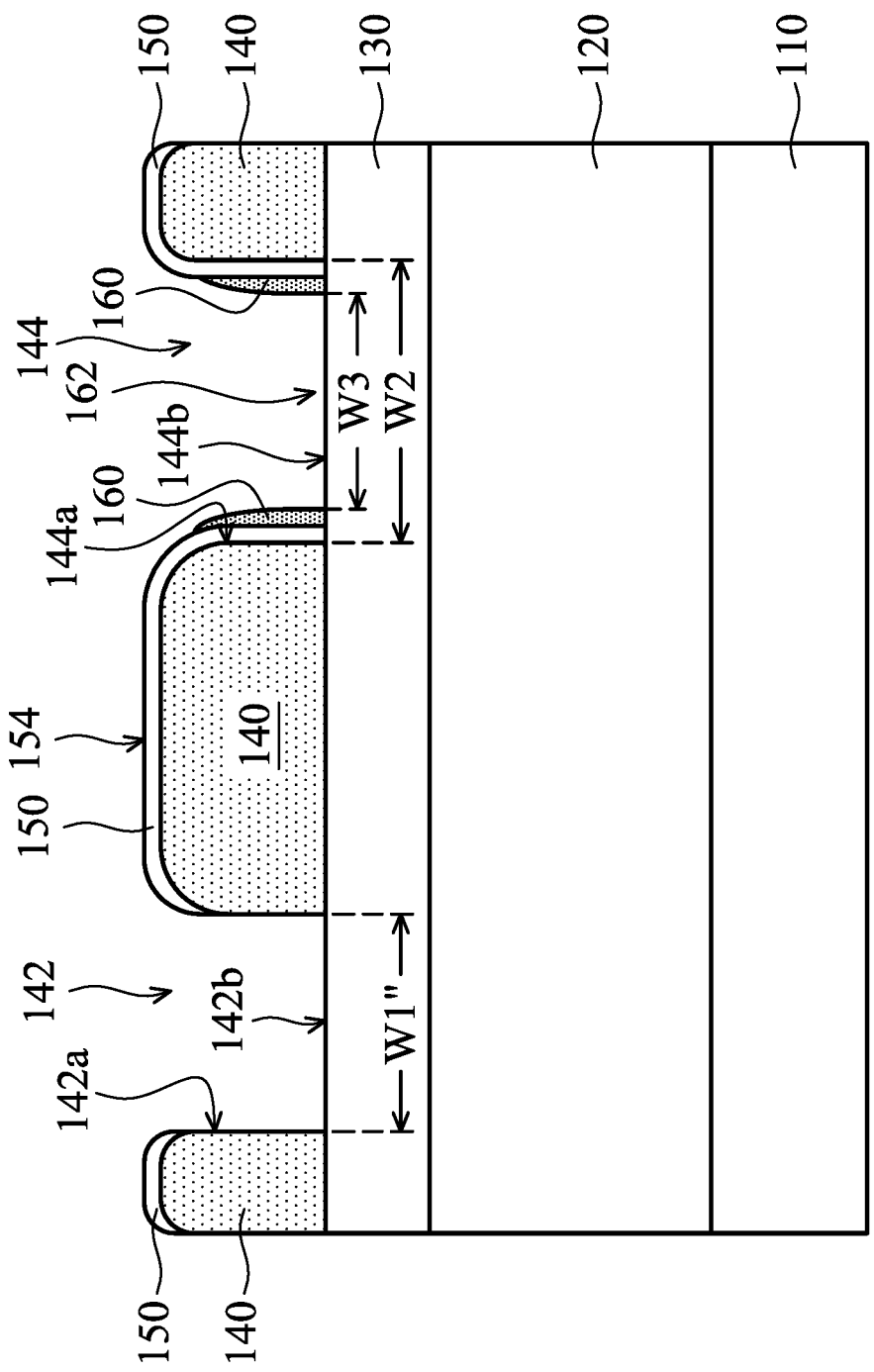

As shown in FIG. 1D, the covering layer 160 is thinned using an etching process, in accordance with some embodiments. The etching process includes an anisotropic etching process, in accordance with some embodiments. In the etching process, the etching rate of the covering layer 160 over the substantially horizontal surfaces (e.g., a top surface 154 of the covering layer 150 and the bottom surfaces 142b and 144b) is greater than the etching rate of the covering layer 160 over the substantially vertical surfaces (e.g., the inner walls 142a and 144a), in accordance with some embodiments. Therefore, the covering layer 160 covering the bottom surfaces 142b and 144b is removed, in accordance with some embodiments. The removal of the covering layer 160 covering the bottom surface 144b forms an opening 162 in the covering layer 160, in accordance with some embodiments. The opening 162 partially exposes the antireflection layer 130, in accordance with some embodiments. The opening 162 has a width W3, which is less than the width W2 of the recess 144, in accordance with some embodiments.

Since the covering layer 160 over the inner walls 142a is thinner than the covering layer 160 over the inner walls 144a, the covering layer 160 over the inner walls 142a is removed after the etching process, in accordance with some embodiments. After the covering layer 160 over the inner walls 142a is removed, a portion of the mask layer 140 is removed from the inner walls 142a by the etching process to widen the recess 142, in accordance with some embodiments.

As shown in FIG. 1D, the recess 142 has a width W1″, which is greater than the width W1′ of the recess 142 of FIG. 1B or 1C, in accordance with some embodiments. The width W1″ is close to the width W3, in accordance with some embodiments. The difference between the widths W1″ and W3 is less than the difference between the widths W1 and W2 (as shown in FIG. 1A), in accordance with some embodiments. Therefore, the width uniformity of the recess 142 and the opening 162 of the step of FIG. 1D is greater than the width uniformity of the recesses 142 and 144 of the step of FIG. 1A, in accordance with some embodiments.

As a result, the mask layer 140 and the covering layers 150 and 160 are together used as an etching mask in subsequently etching processes to improve the critical dimension uniformity (e.g., the width uniformity) of holes formed by the subsequently etching processes. The width W3 is slightly greater than the width W1″, in accordance with some embodiments. In some embodiments, a ratio of the width W3 to the width W1″ ranges from about 1.1 to 1.3. For example, the ratio (W3/W1″) is about 1.2.

The anisotropic etching process includes a dry etching process (e.g., a plasma etching process), in accordance with some embodiments. In some embodiments, the covering layer 160 is formed using a plasma deposition process and the covering layer 160 is thinned using a plasma etching process. The covering layer 160 is formed and thinned in the same plasma chamber, in accordance with some embodiments.

Figure 1E:
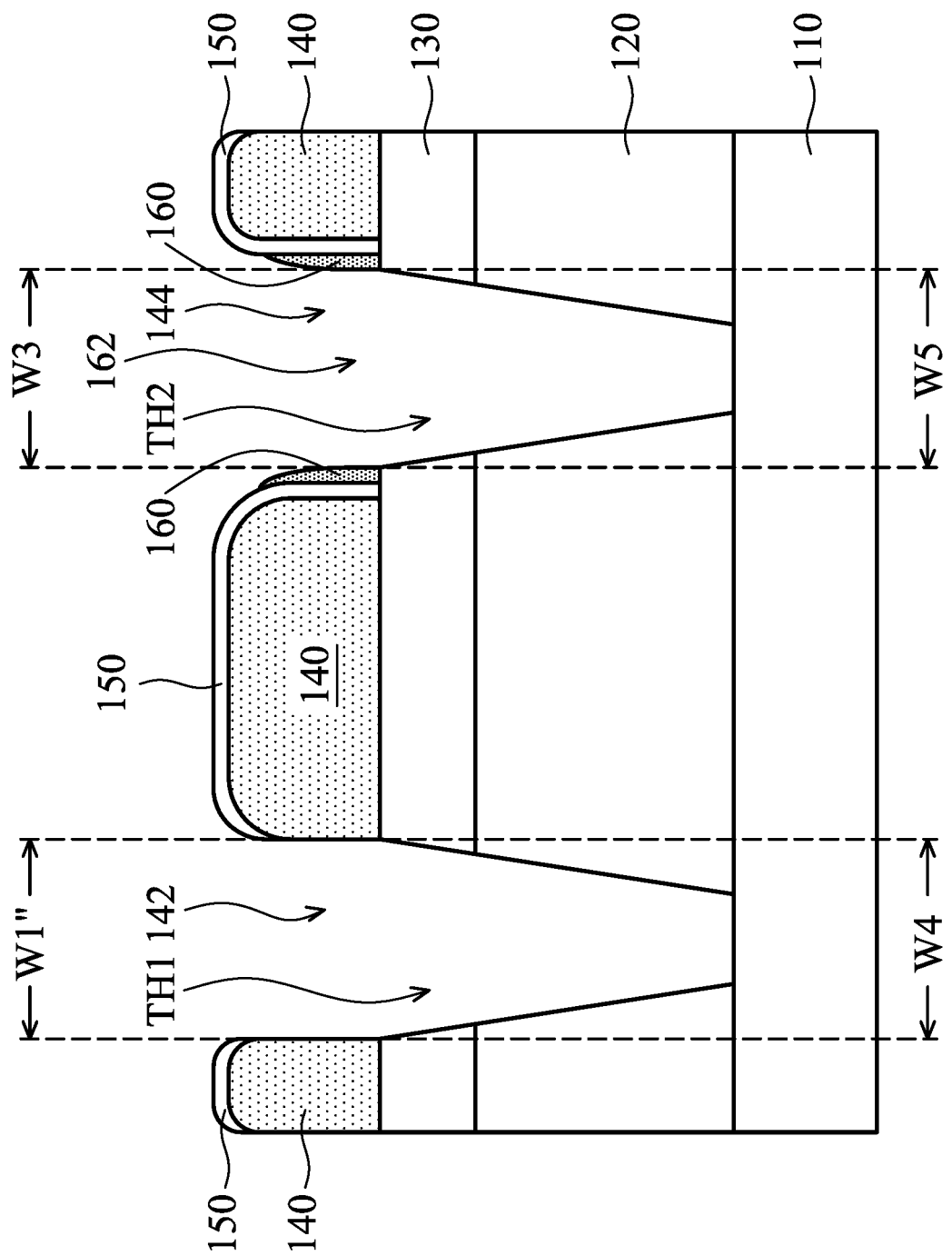

As shown in FIG. 1E, the portions of the mask layer 120 and the antireflection layer 130 are removed through the recess 142 and the opening 162 to form through holes TH1 and TH2 passing through the mask layer 120 and the antireflection layer 130, in accordance with some embodiments. The through holes TH1 and TH2 are respectively under the recess 142 and the opening 162, in accordance with some embodiments. Since the width uniformity of the recess 142 and the opening 162 of the step of FIG. 1D is good, the width uniformity of the through holes TH1 and TH2 is good as well.

The through hole TH1 has a width (or a maximum width) W4, in accordance with some embodiments. The through hole TH2 has a width (or a maximum width) W5, in accordance with some embodiments. Since the width W1″ is close to the width W3, the width W4 is close to the width W5, in accordance with some embodiments. The width W5 is slightly greater than the width W4, in accordance with some embodiments. In some embodiments, a ratio of the width W5 to the width W4 ranges from about 1.1 to 1.3. For example, the ratio (W5/W4) is about 1.2.

Figure 1G:
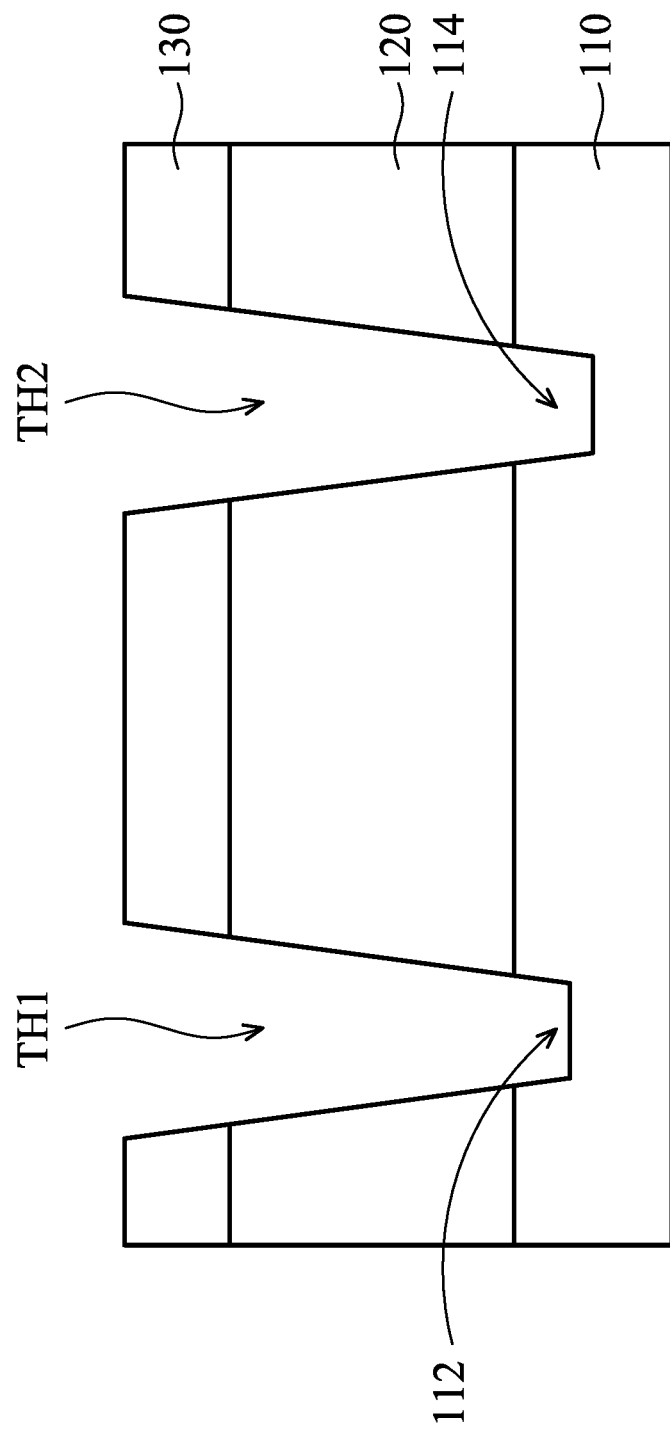

As shown in FIG. 1F, the mask layer 140 and the covering layers 150 and 160 are removed, in accordance with some embodiments. The removal process includes an etching process, such as a wet etching process or a dry etching process, in accordance with some embodiments. As shown in FIG. 1G, portions of the layer 110 are removed through the through holes TH1 and TH2 to form recesses 112 and 114 in the layer 110, in accordance with some embodiments. The recesses 112 and 114 are respectively under the through holes TH1 and TH2, in accordance with some embodiments.

Figure 1H:
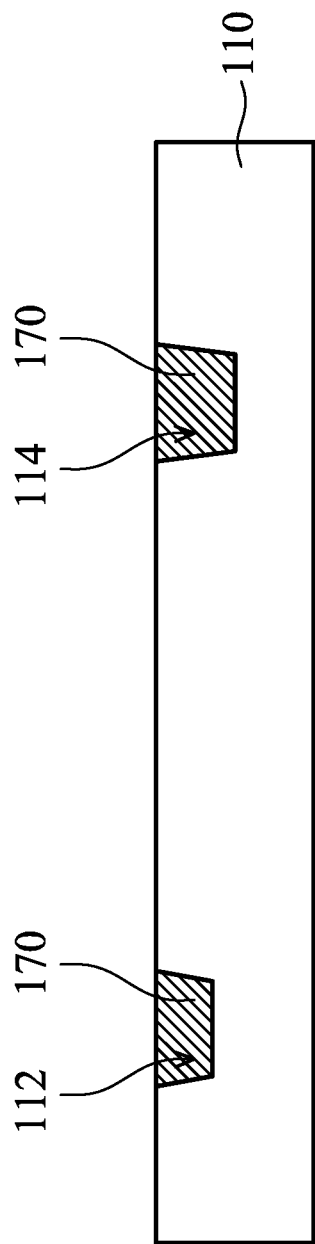

As shown in FIG. 1H, the mask layer 120 and the antireflection layer 130 are removed, in accordance with some embodiments. The removal process includes an etching process, such as a wet etching process or a dry etching process, in accordance with some embodiments. As shown in FIG. 1H, structures 170 are formed in the recesses 112 and 114, in accordance with some embodiments. The structures 170 include conductive structures (e.g., contact plugs, conductive lines, or conductive vias), insulating structures, or semiconductor structures, in accordance with some embodiments. The structures 170 are made of metal, alloy, oxides (e.g., silicon dioxide), nitrides, or another suitable material, in accordance with some embodiments.

Figure 2A:
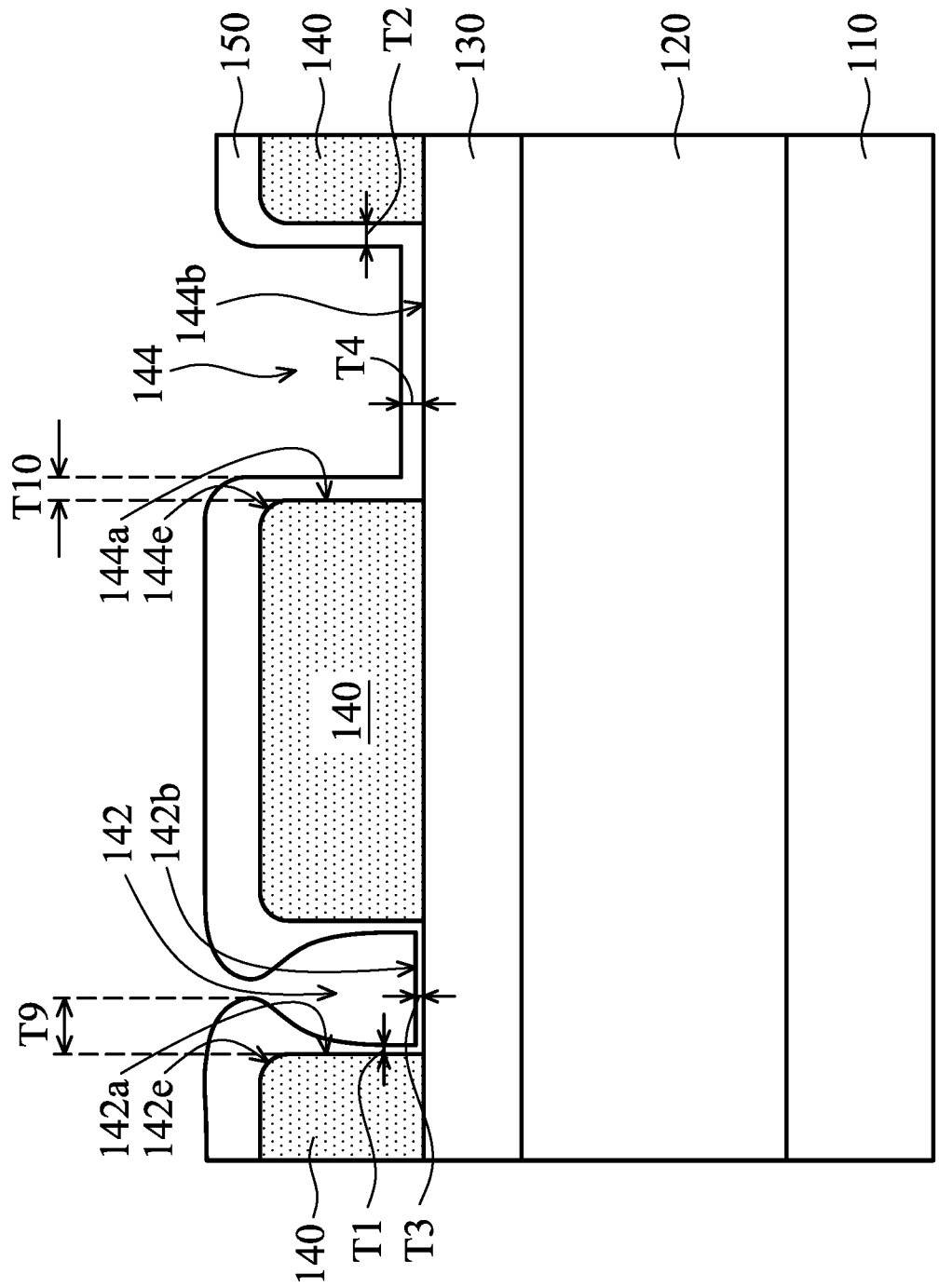
FIGS. 2A-2G are cross-sectional views of various stages of a process for forming a semiconductor device structure, in accordance with some embodiments.

FIGS. 2A-2G are cross-sectional views of various stages of a process for forming a semiconductor device structure, in accordance with some embodiments. As shown in FIG. 2A, the step of FIG. 1A is performed, and the covering layer 150 is formed using a chemical vapor deposition process, in accordance with some embodiments. The chemical vapor deposition process includes a high pressure chemical vapor deposition process, in accordance with some embodiments. The process pressure of the chemical vapor deposition process ranges from about 10 torr to about 30 torr, in accordance with some embodiments.

The covering layer 150 covering an upper edge 142e of the recess 142 is thicker than the covering layer 150 covering an upper edge 144e of the recess 144, in accordance with some embodiments. That is, a thickness T9 of the covering layer 150 covering the upper edge 142e is greater than a thickness T10 of the covering layer 150 covering the upper edge 144e, in accordance with some embodiments.

The thickness T1 of the covering layer 150 covering the inner walls 142a is less than the thickness T2 of the covering layer 150 covering the inner walls 144a, in accordance with some embodiments. The thickness T3 of the covering layer 150 covering the bottom surface 142b is less than the thickness T4 of the covering layer 150 covering the bottom surface 144b, in accordance with some embodiments.

Figure 2B:
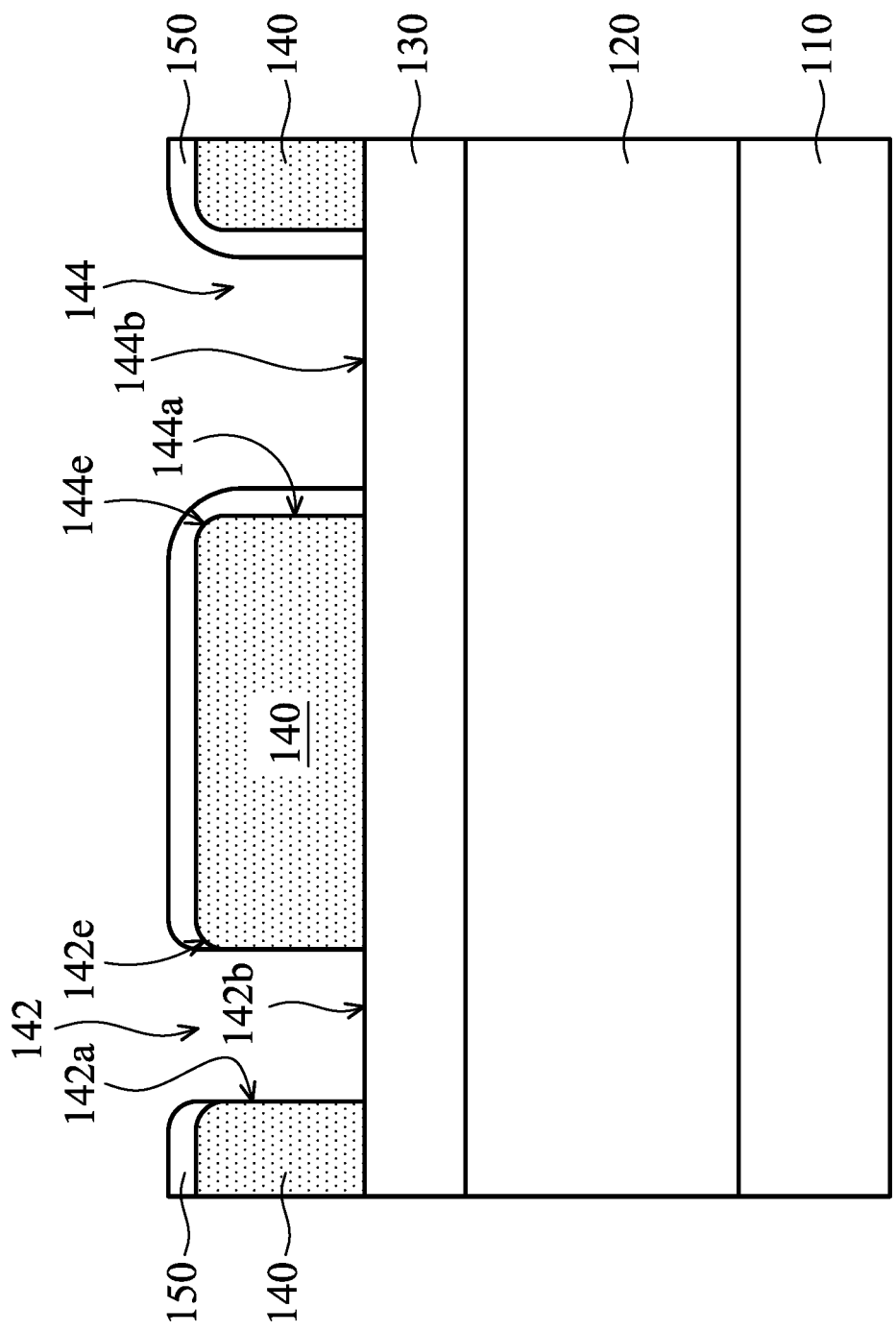

As shown in FIG. 2B, the covering layer 150 is thinned using an etching process, in accordance with some embodiments. The covering layer 150 over the inner walls 142a and the bottom surfaces 142b and 144b of the recesses 142 and 144 are removed after the covering layer 150 is thinned, in accordance with some embodiments. The remaining covering layer 150 over the upper edge 144e has a rounder profile than the remaining covering layer 150 over the upper edge 142e, in accordance with some embodiments. The etching process includes an anisotropic etching process, in accordance with some embodiments.

Figure 2C:
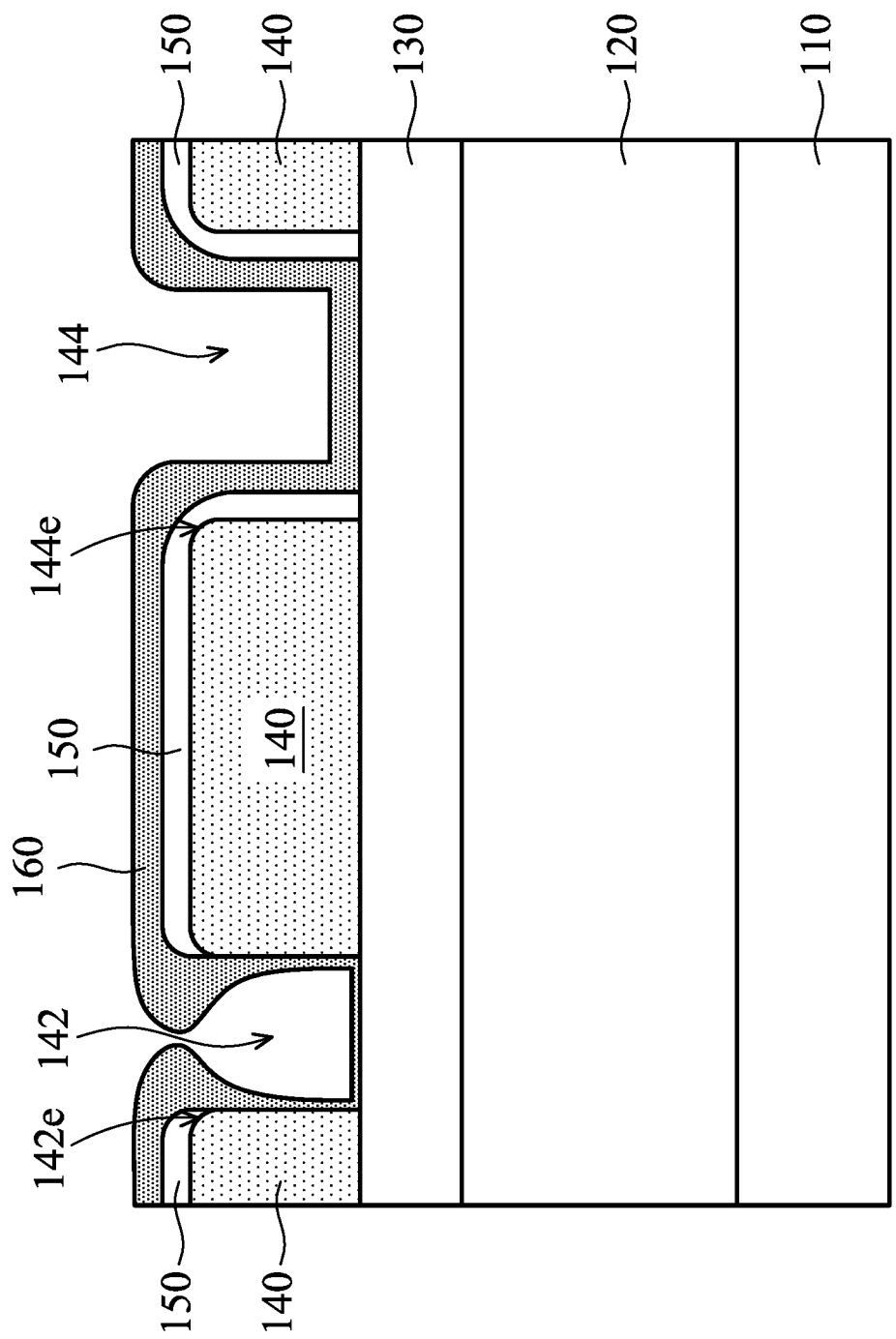

As shown in FIG. 2C, a covering layer 160 is deposited over the mask layer 150 and is deposited in the recesses 142 and 144, in accordance with some embodiments. The covering layer 160 in the recess 142 is thinner than the covering layer 160 in the recess 144, in accordance with some embodiments. The covering layer 160 is formed using a chemical vapor deposition process, such as a high pressure chemical vapor deposition process, in accordance with some embodiments.

The process pressure of the chemical vapor deposition process ranges from about 10 torr to about 30 torr, in accordance with some embodiments. The covering layer 160 covering the upper edge 142e of the recess 142 is thicker than the covering layer 160 covering the upper edge 144e of the recess 144, in accordance with some embodiments.

Figure 2D:
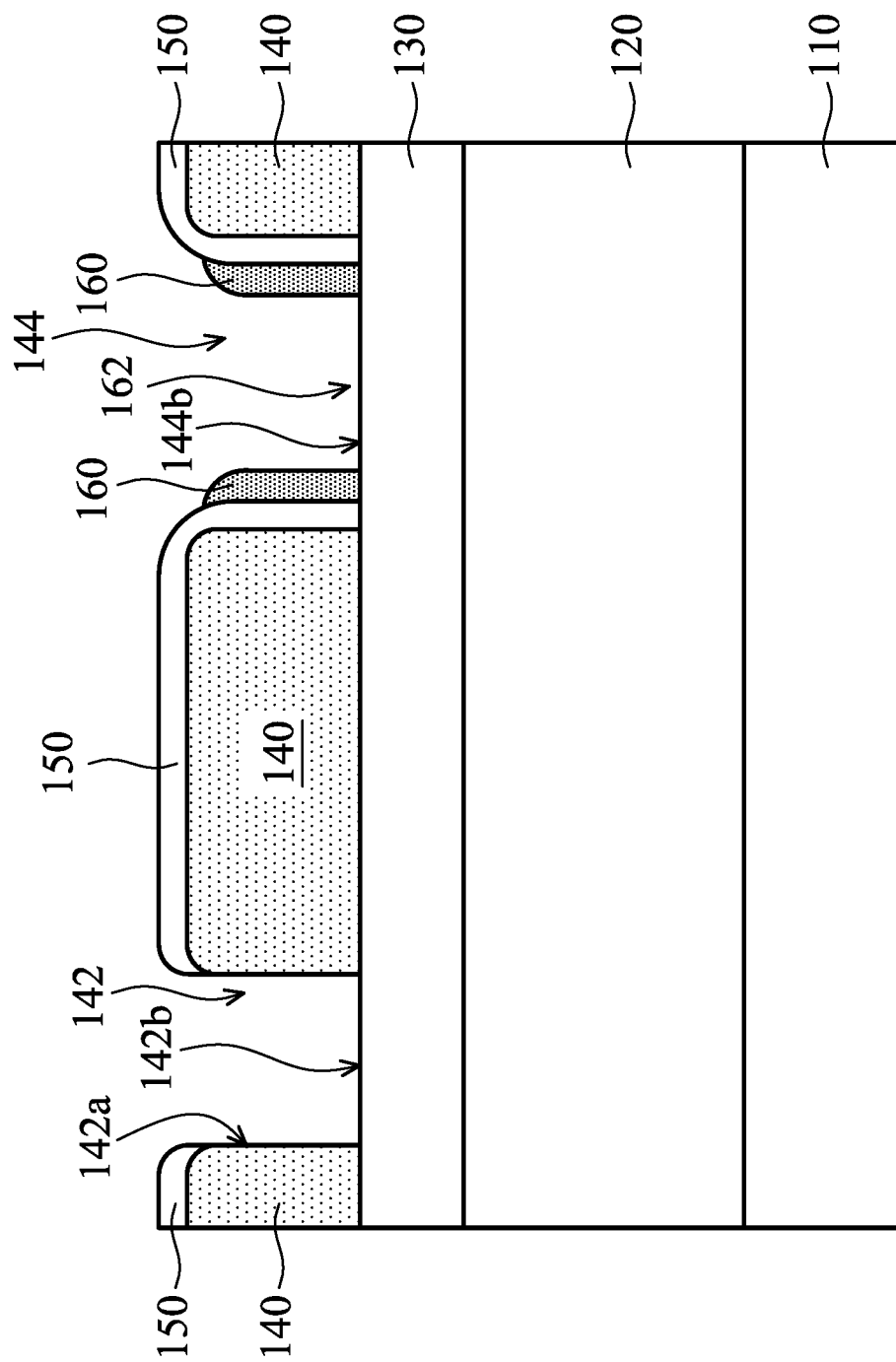

As shown in FIG. 2D, the covering layer 160 is thinned using an etching process, in accordance with some embodiments. The covering layer 160 over the inner walls 142a and the bottom surfaces 142b and 144b of the recesses 142 and 144 are removed after the covering layer 160 is thinned, in accordance with some embodiments. The removal process forms an opening 162 in the covering layer 160 in the recess 144, in accordance with some embodiments. The etching process includes an anisotropic etching process, in accordance with some embodiments.

Figure 2E:
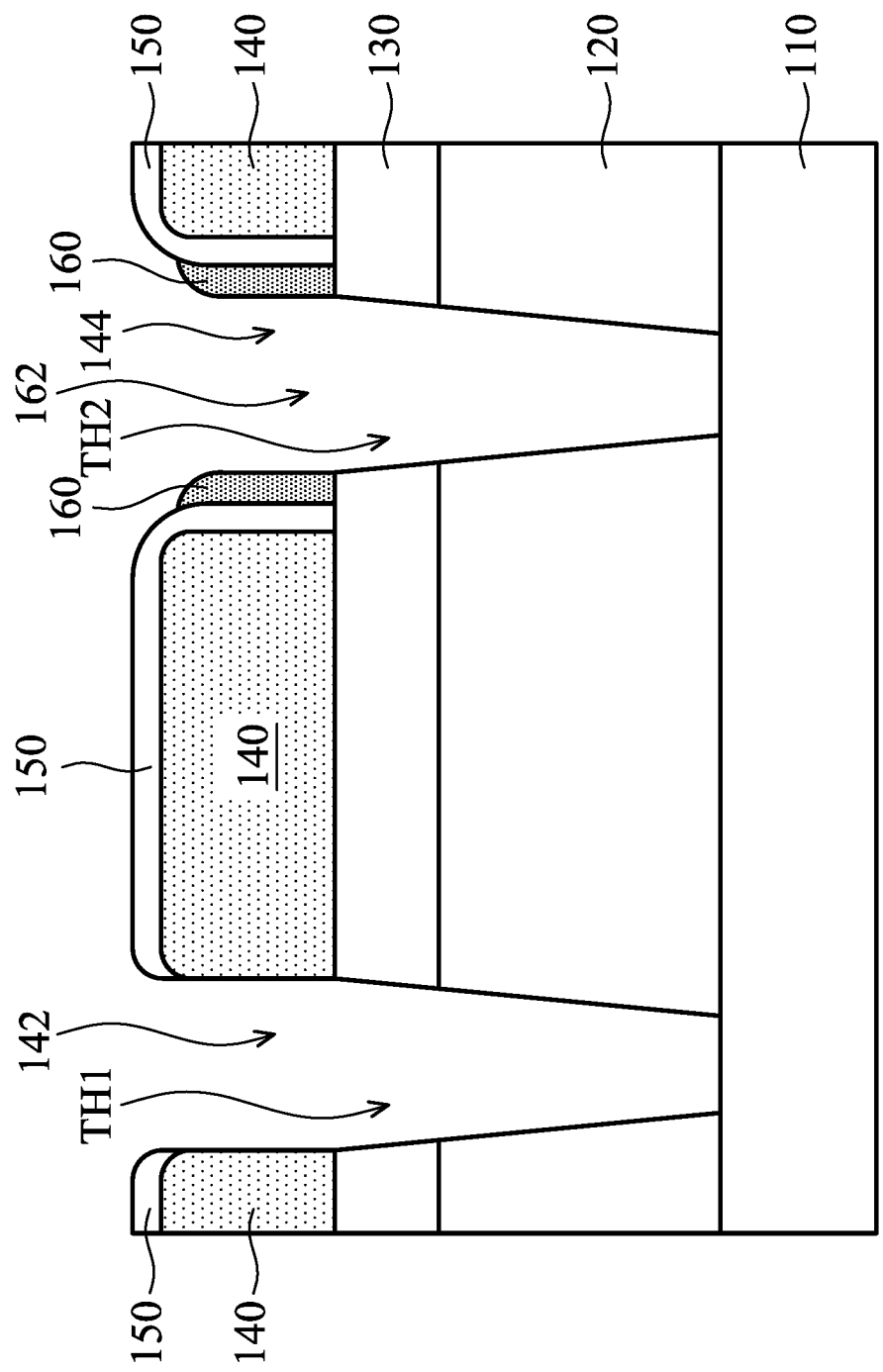

As shown in FIG. 2E, the portions of the mask layer 120 and the antireflection layer 130 are removed through the recess 142 and the opening 162 to form through holes TH1 and TH2 passing through the mask layer 120 and the antireflection layer 130, in accordance with some embodiments. The through holes TH1 and TH2 are respectively under the recess 142 and the opening 162, in accordance with some embodiments.

Figure 2F:
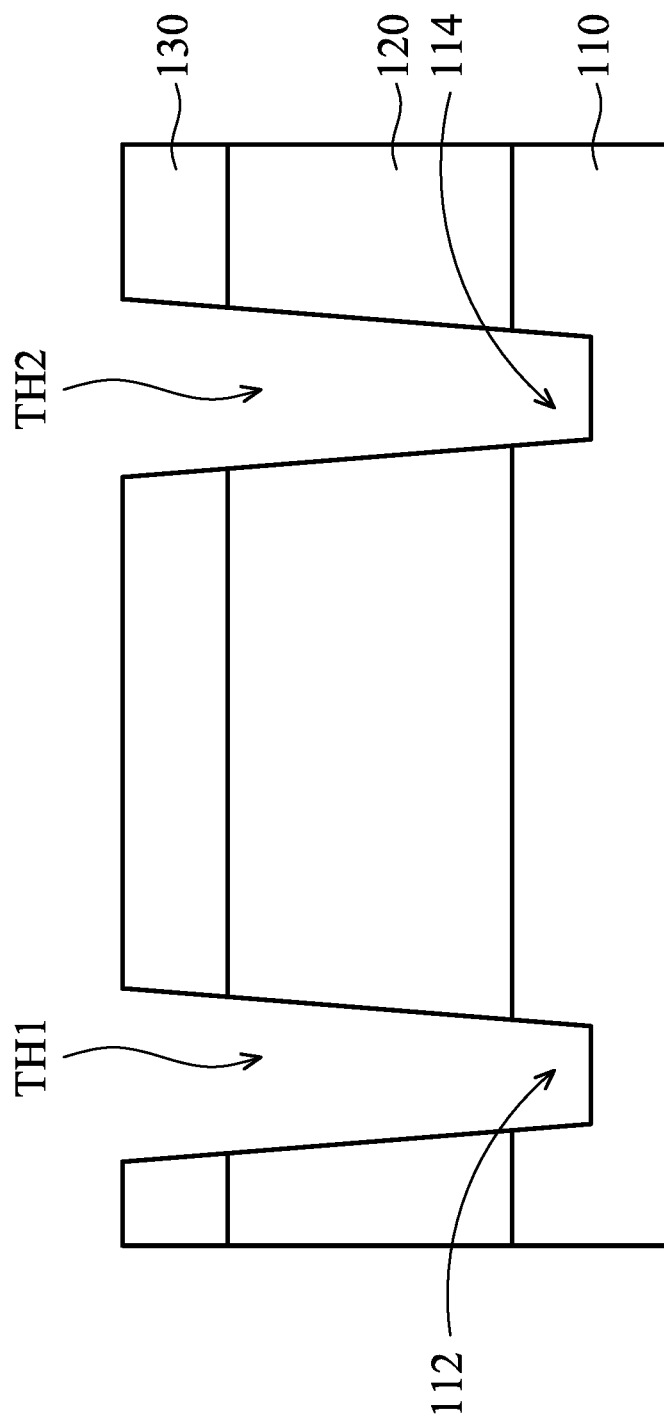

As shown in FIG. 2F, the mask layer 140 and the covering layers 150 and 160 are removed, in accordance with some embodiments. The removal process includes an etching process, such as a wet etching process or a dry etching process, in accordance with some embodiments. As shown in FIG. 2F, portions of the layer 110 are removed through the through holes TH1 and TH2 to form recesses 112 and 114 in the layer 110, in accordance with some embodiments. The recesses 112 and 114 are respectively under the through holes TH1 and TH2, in accordance with some embodiments.

Figure 2G:
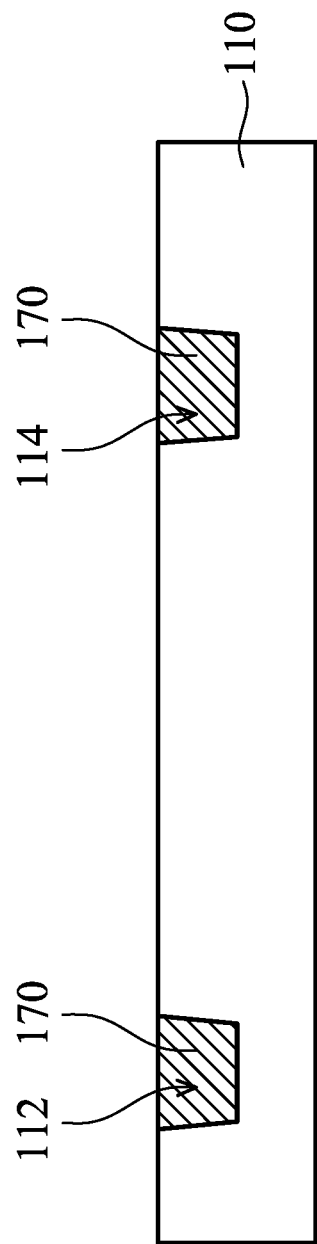

As shown in FIG. 2G, the mask layer 120 and the antireflection layer 130 are removed, in accordance with some embodiments. The removal process includes an etching process, such as a wet etching process or a dry etching process, in accordance with some embodiments. As shown in FIG. 2G, structures 170 are formed in the recesses 112 and 114, in accordance with some embodiments. The structures 170 include conductive structures (e.g., contact plugs, conductive lines, or conductive vias), insulating structures, or semiconductor structures, in accordance with some embodiments. The structures 170 are made of metal, alloy, oxides (e.g., silicon dioxide), nitrides, or another suitable material, in accordance with some embodiments.

Figure 3A:
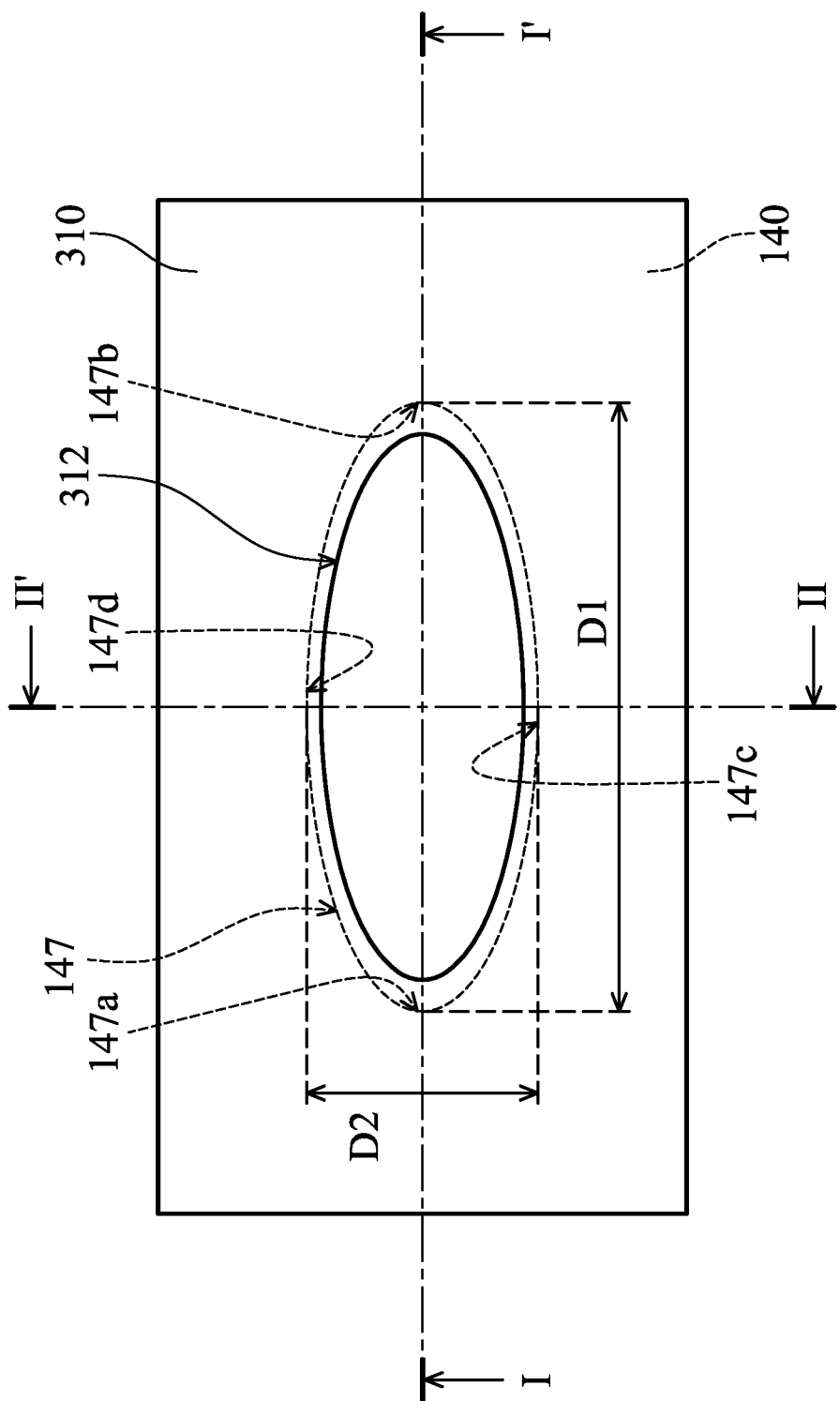
FIGS. 3A-3G are top views of various stages of a process for forming a semiconductor device structure, in accordance with some embodiments.
Figures 1, 3A:
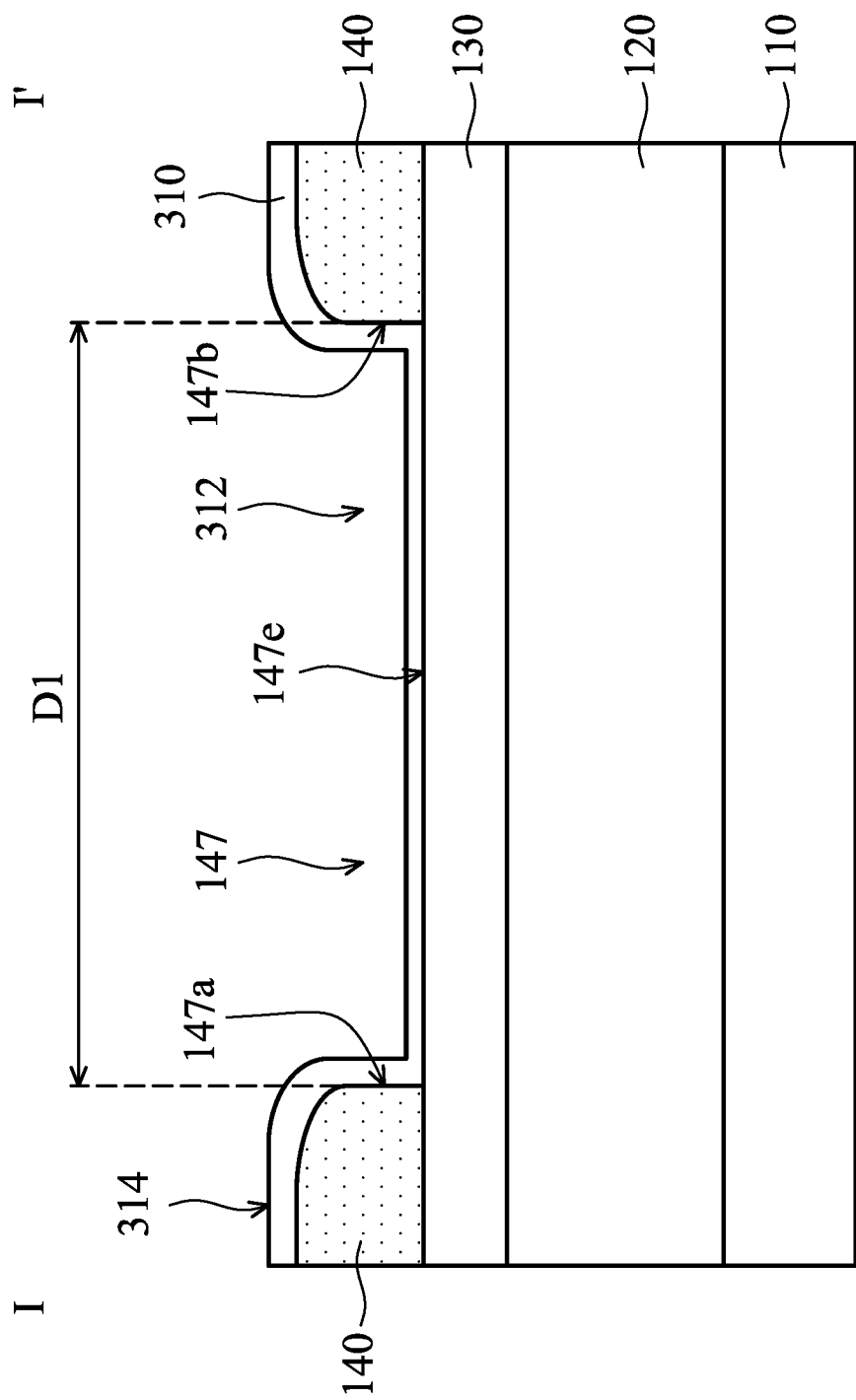
Figures 2, 3A:
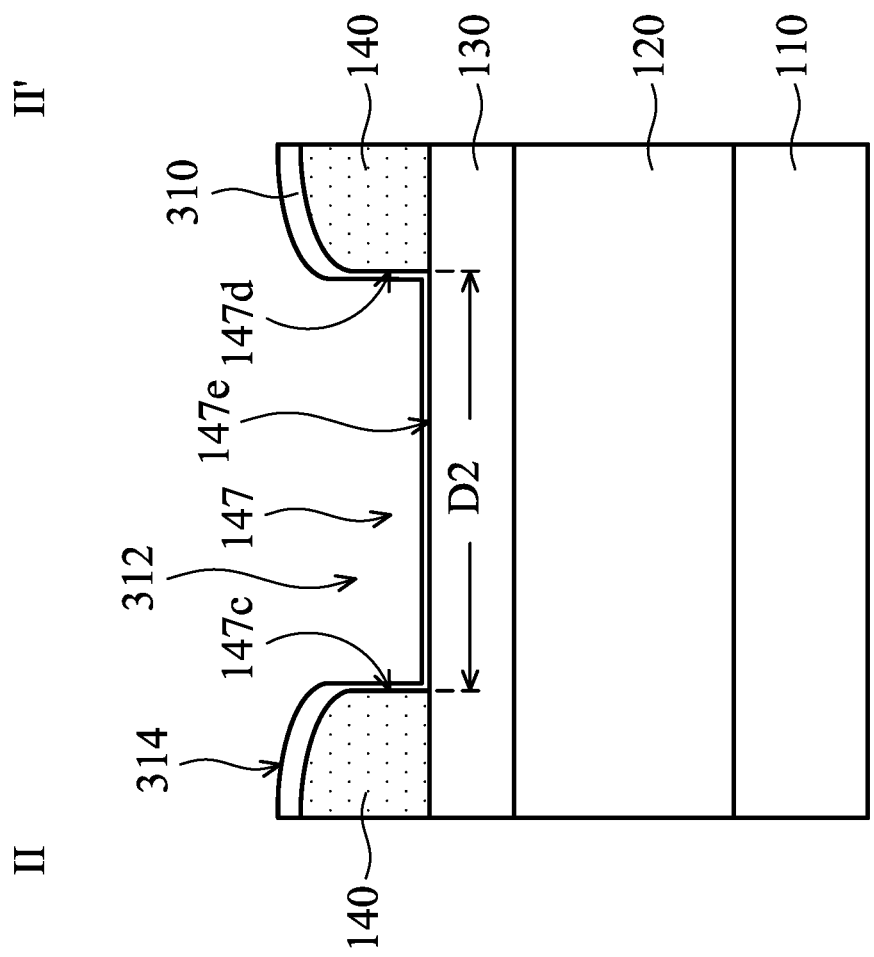
Figure 3B:
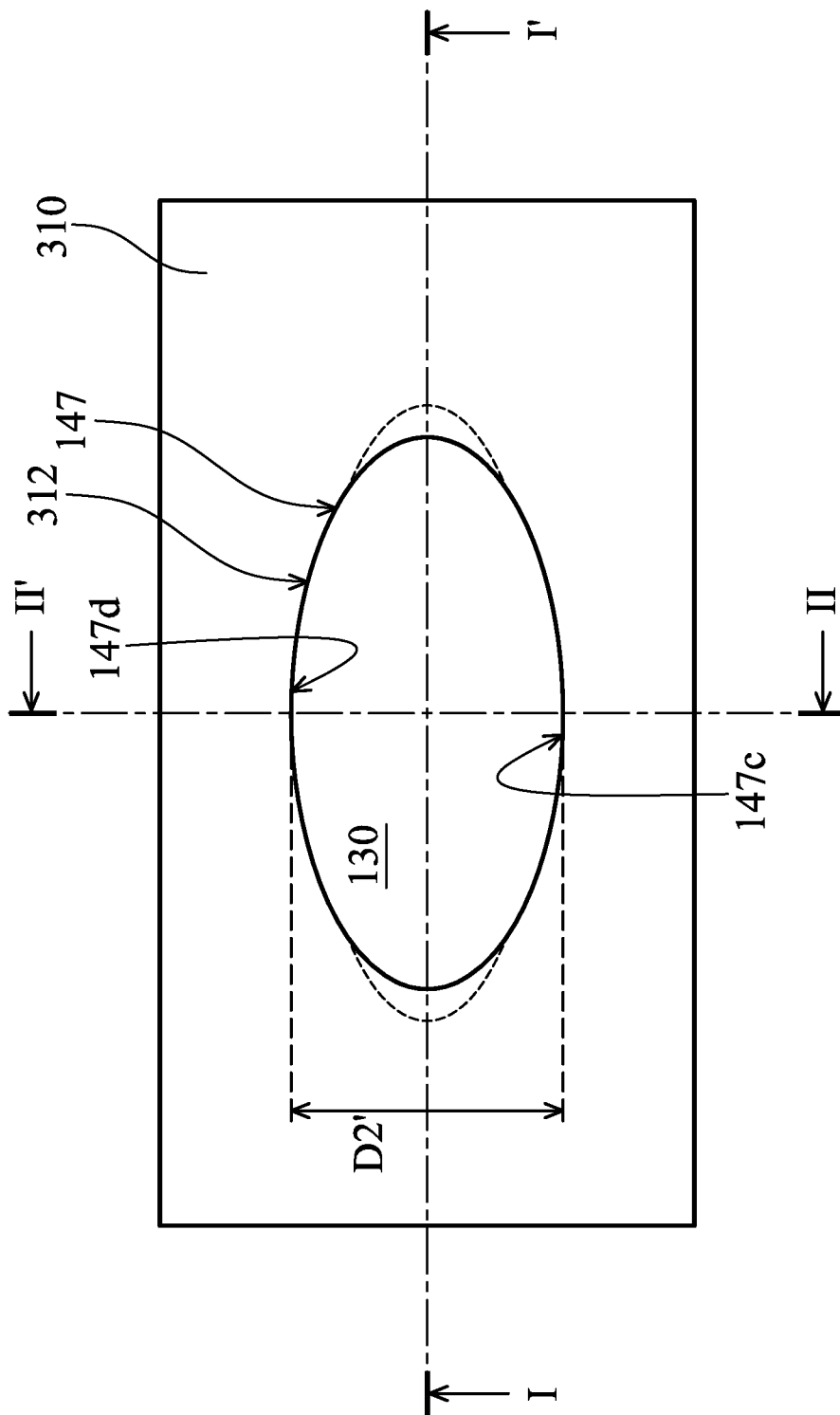
Figures 1, 3B:
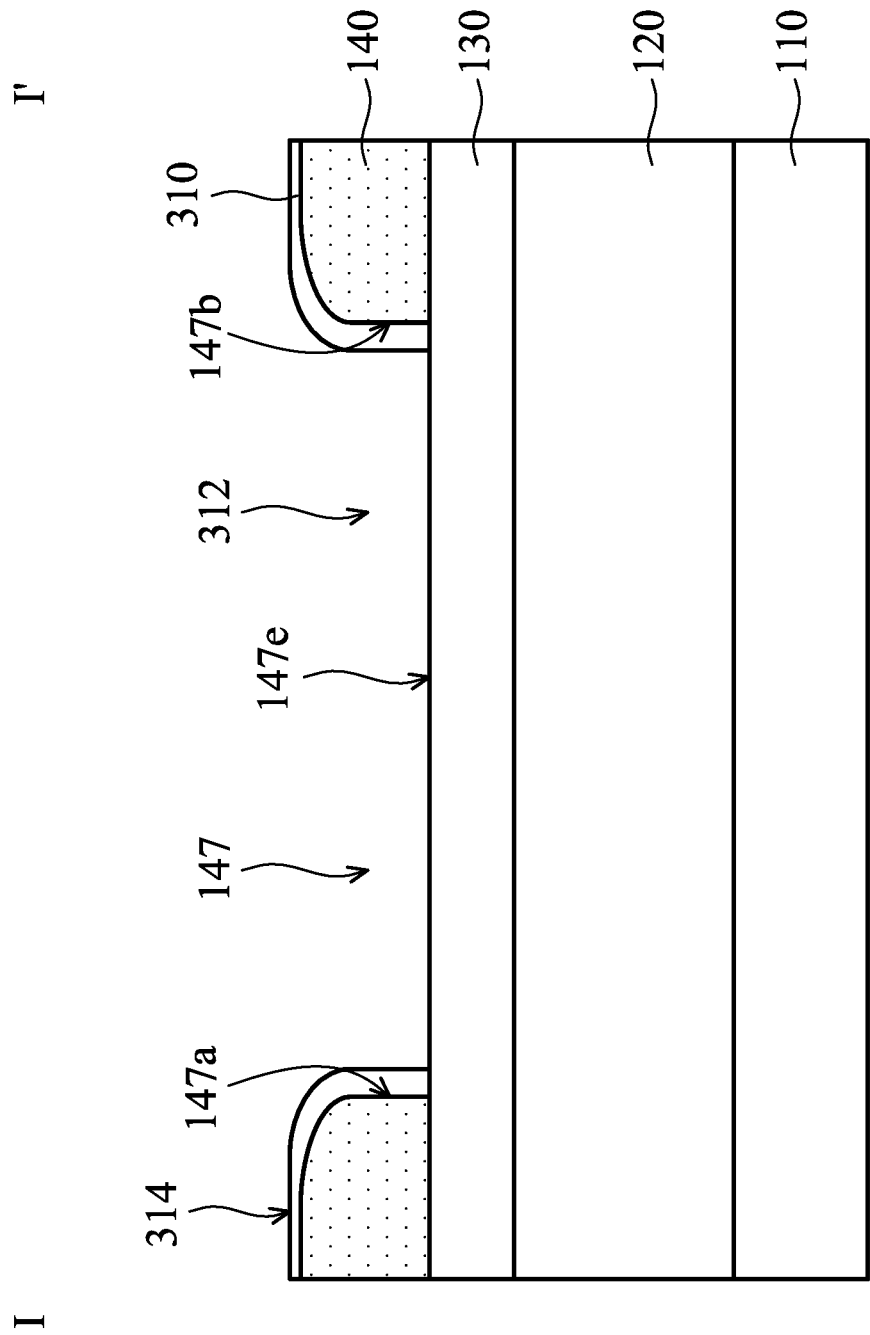
Figures 2, 3B:
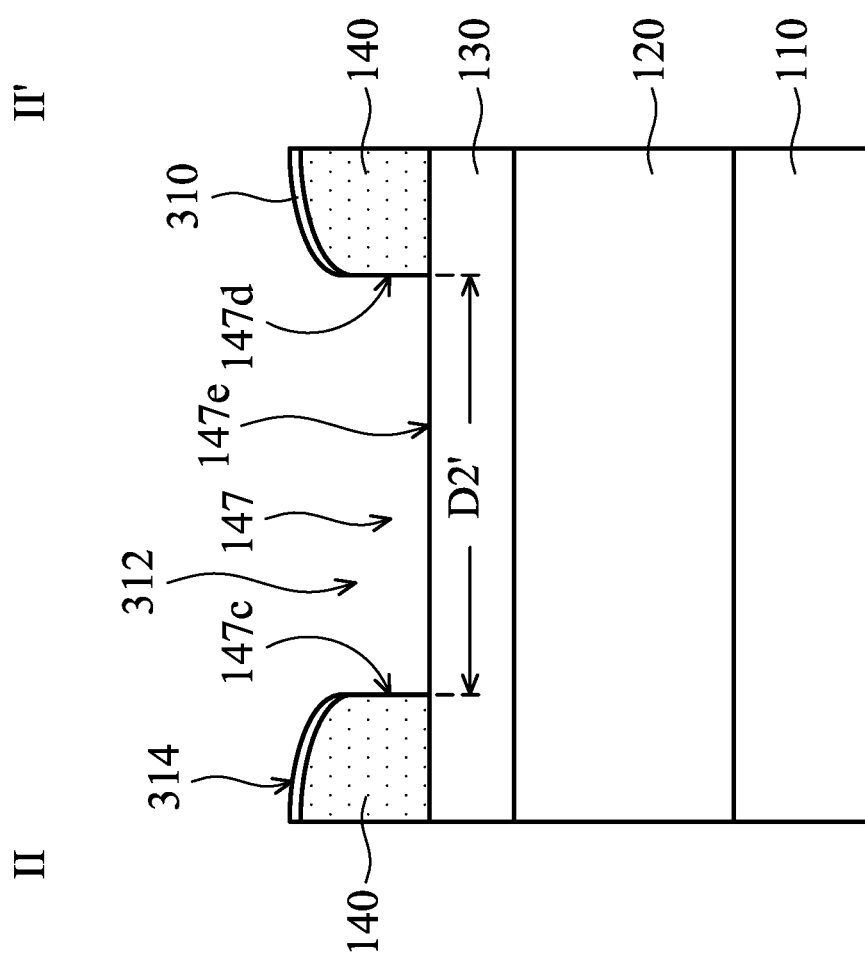
Figure 3C:
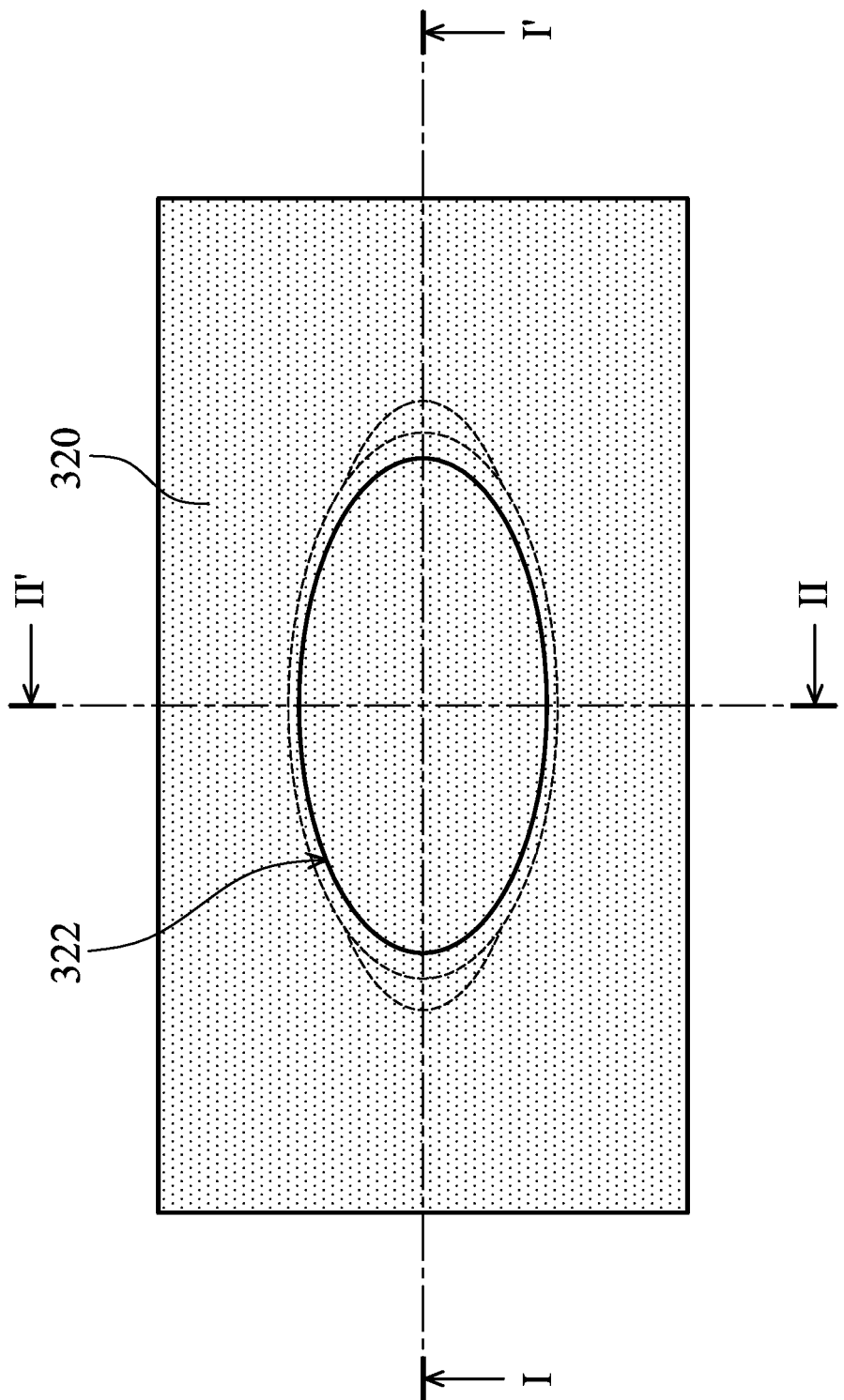
Figures 1, 3C:
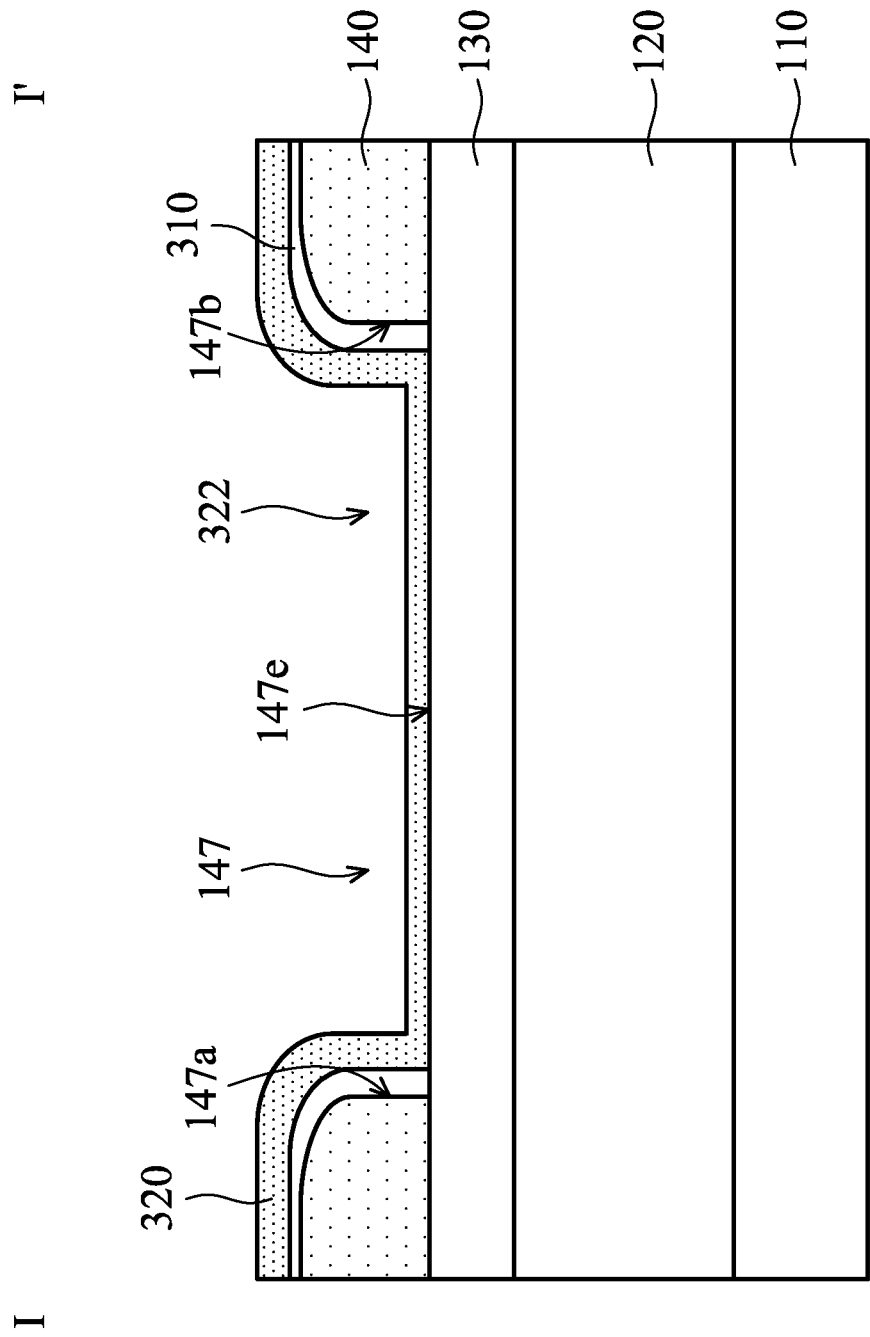
Figures 2, 3C:
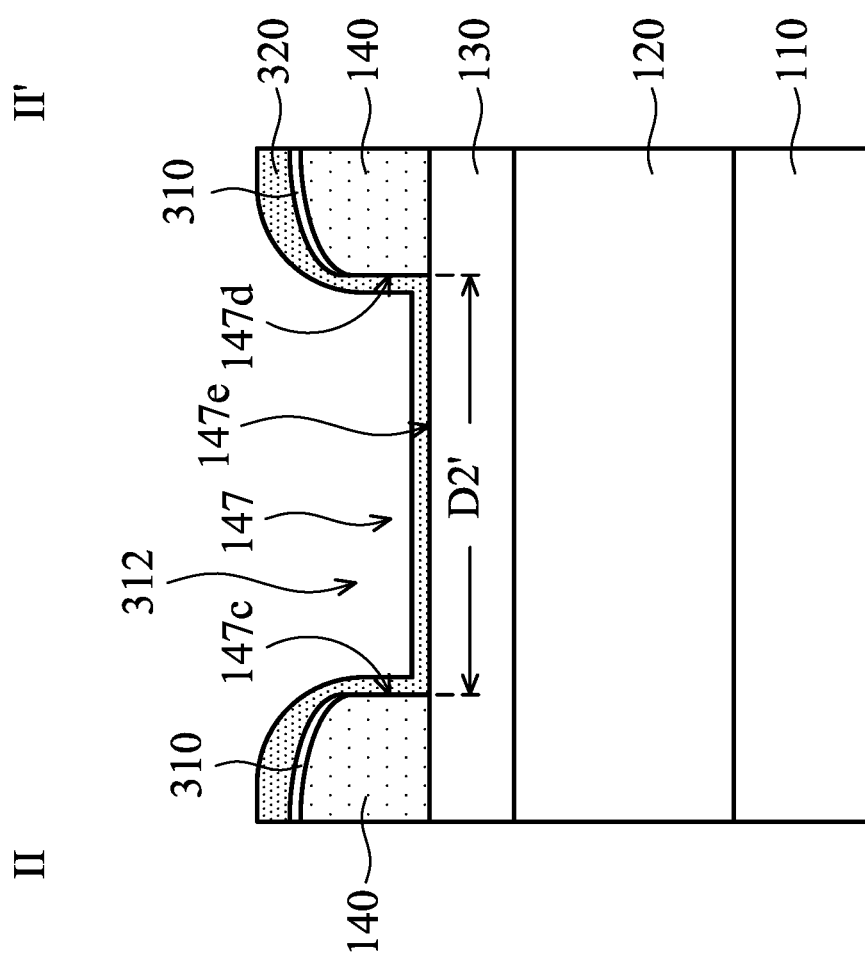
Figure 3D:
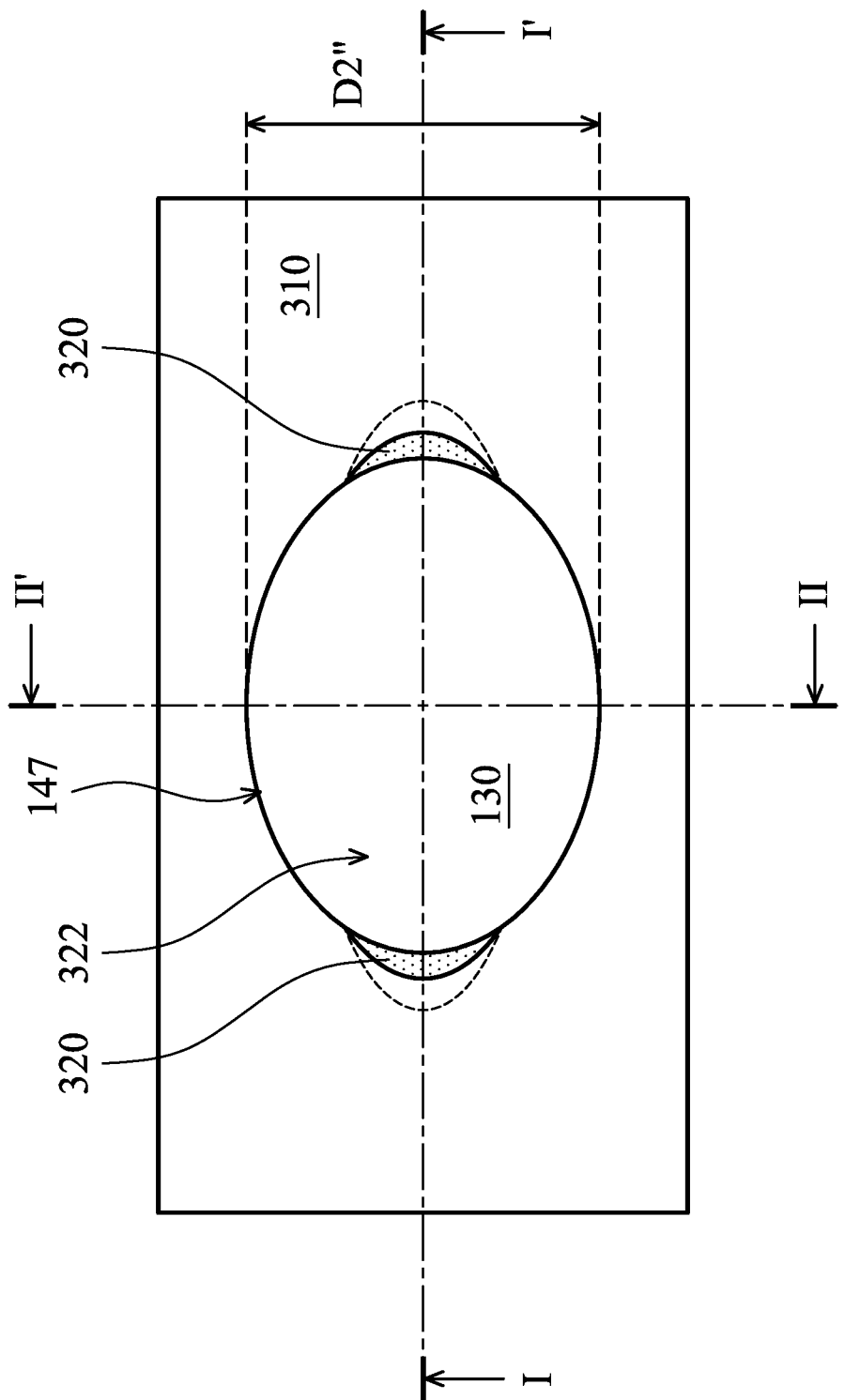
Figures 1, 3D:
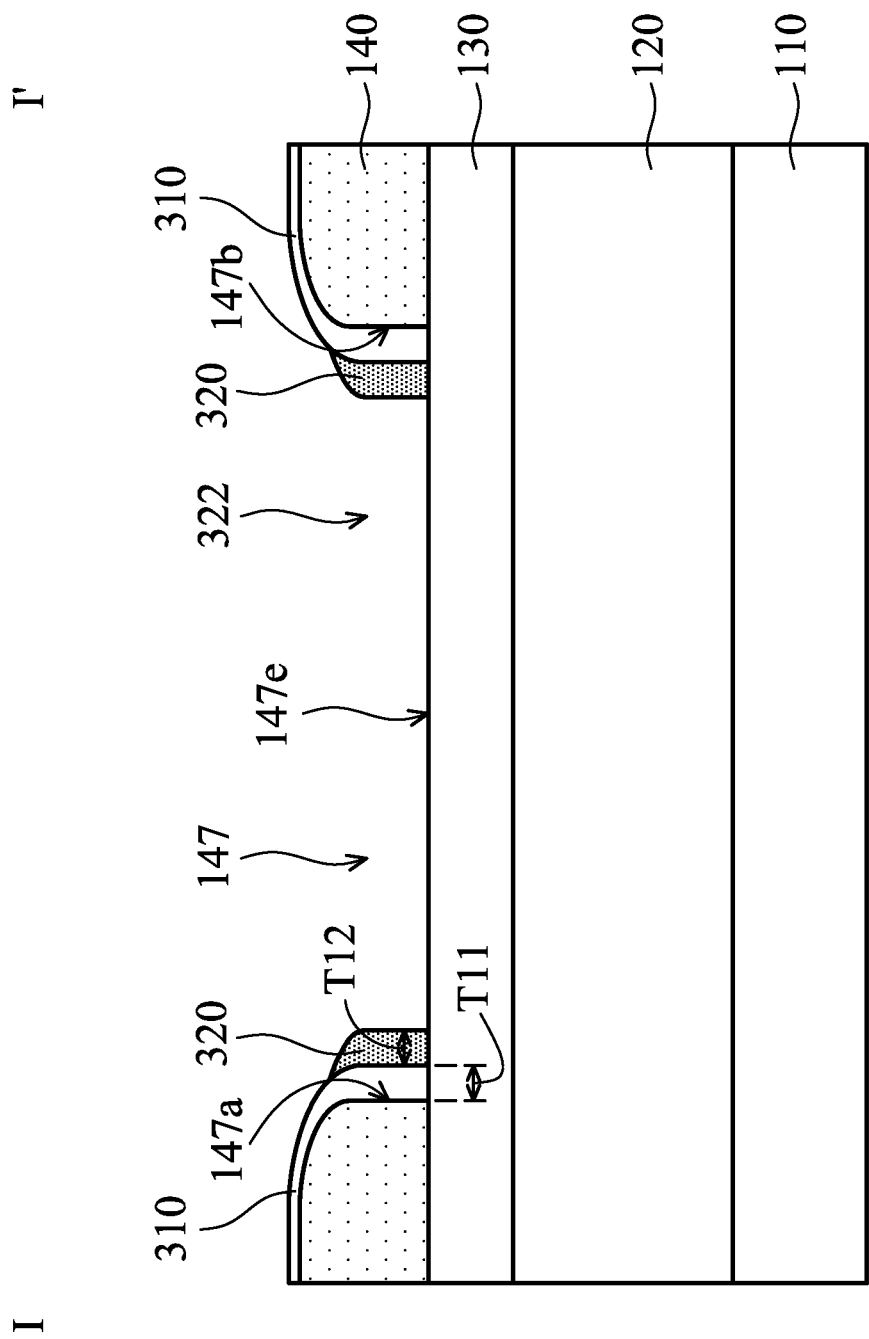
Figures 2, 3D:
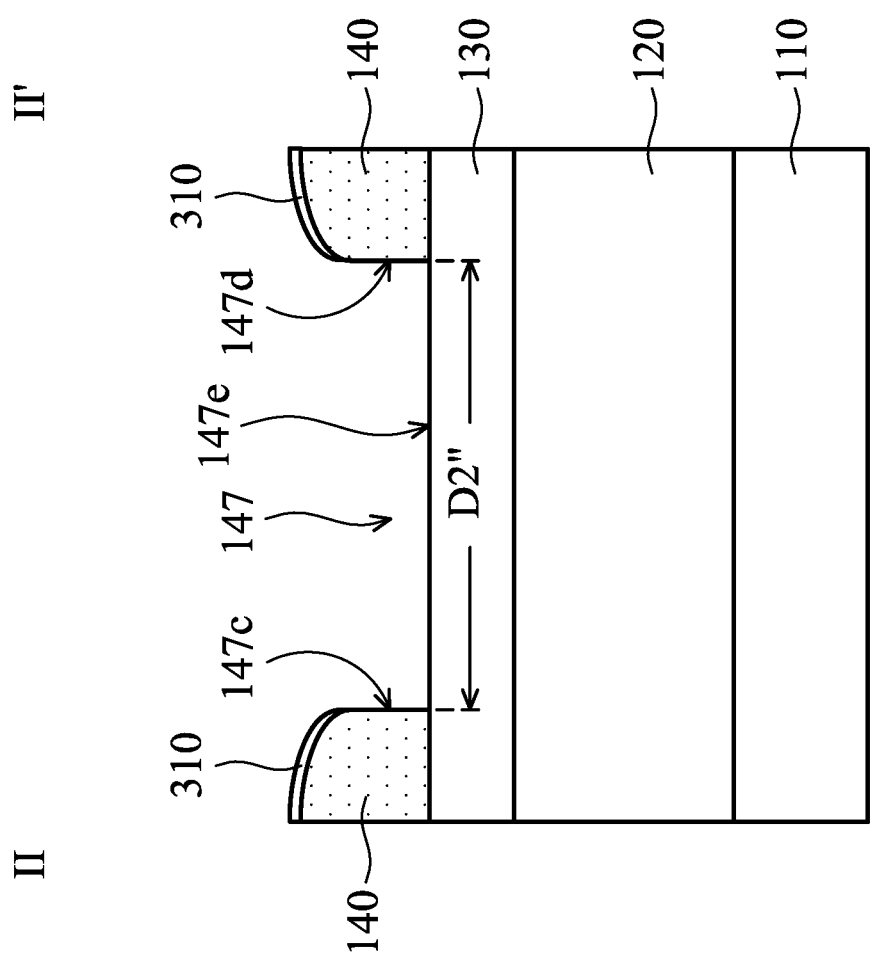
Figure 3E:
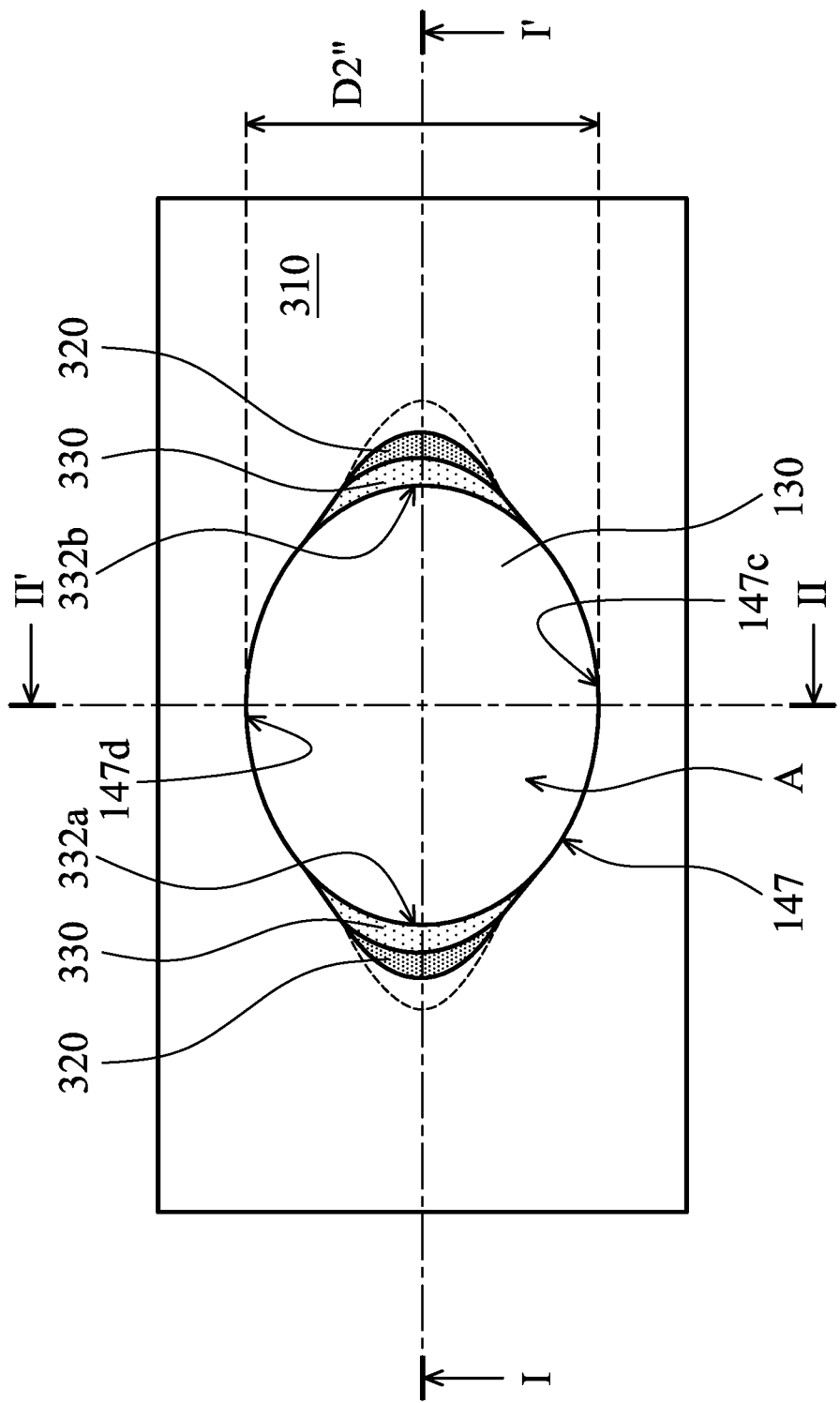
Figures 1, 3E:
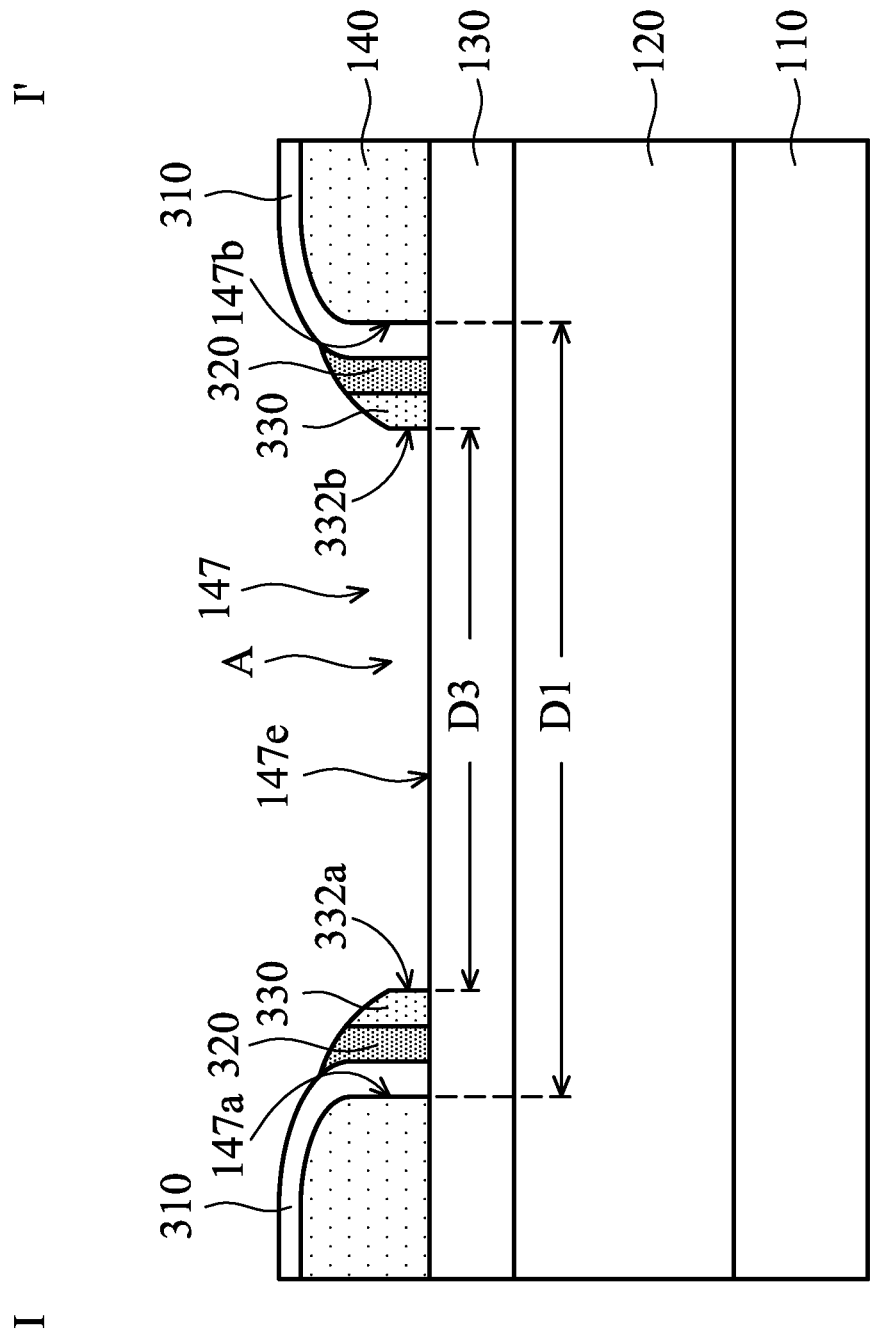
Figures 2, 3E:
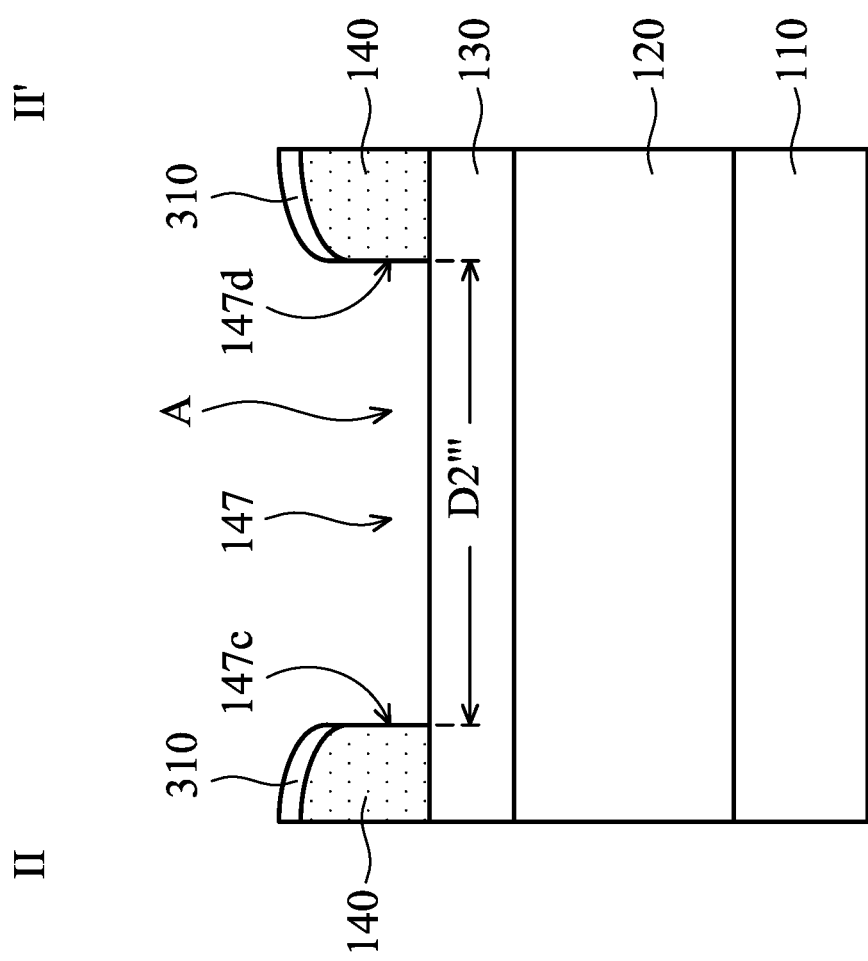
Figure 3F:
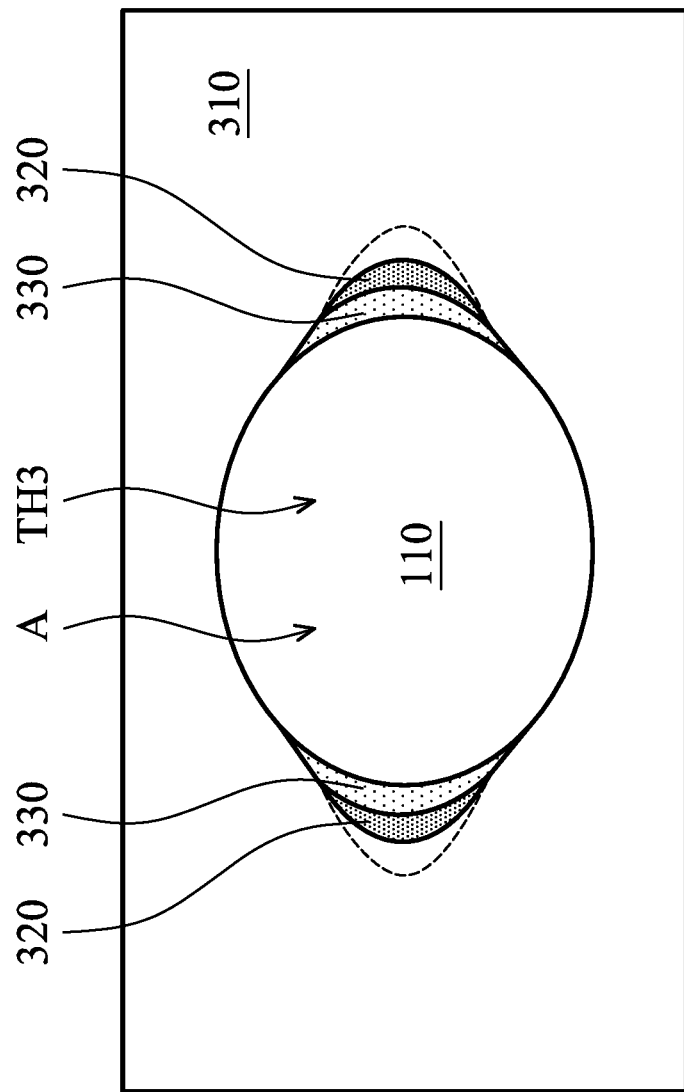
Figures 1, 3F:
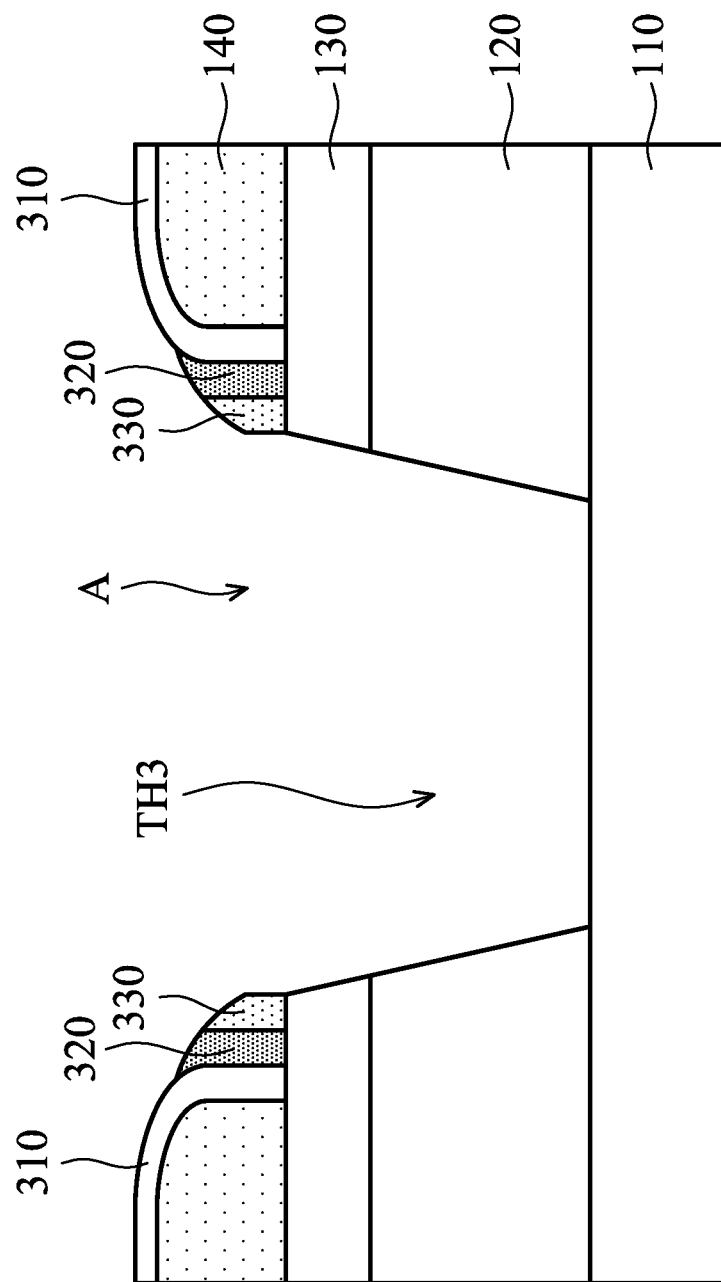
Figures 2, 3F:
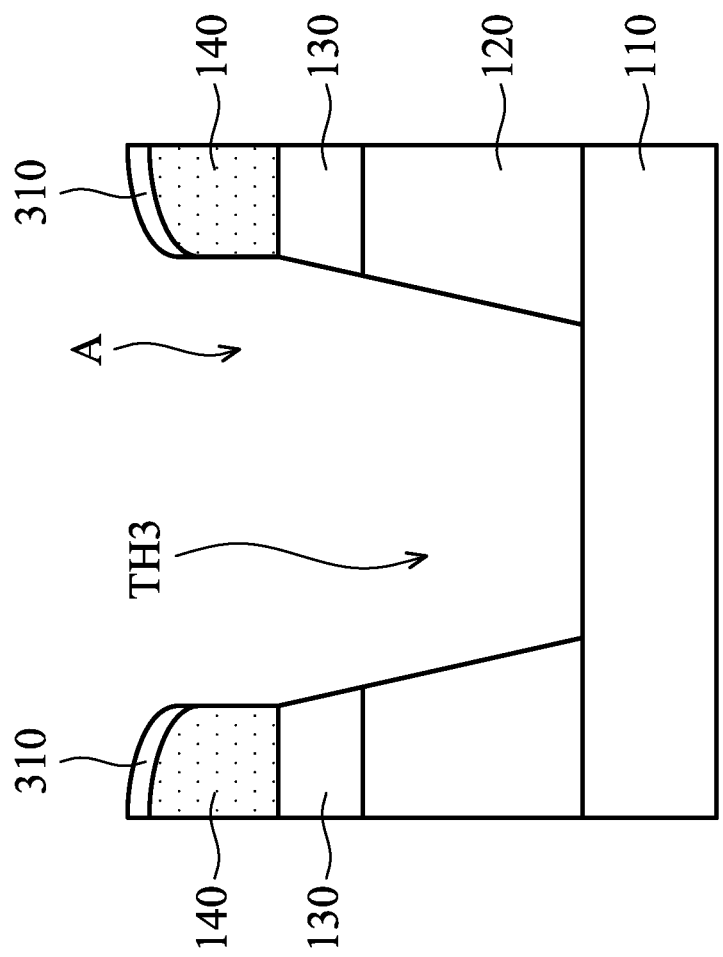
Figure 3G:
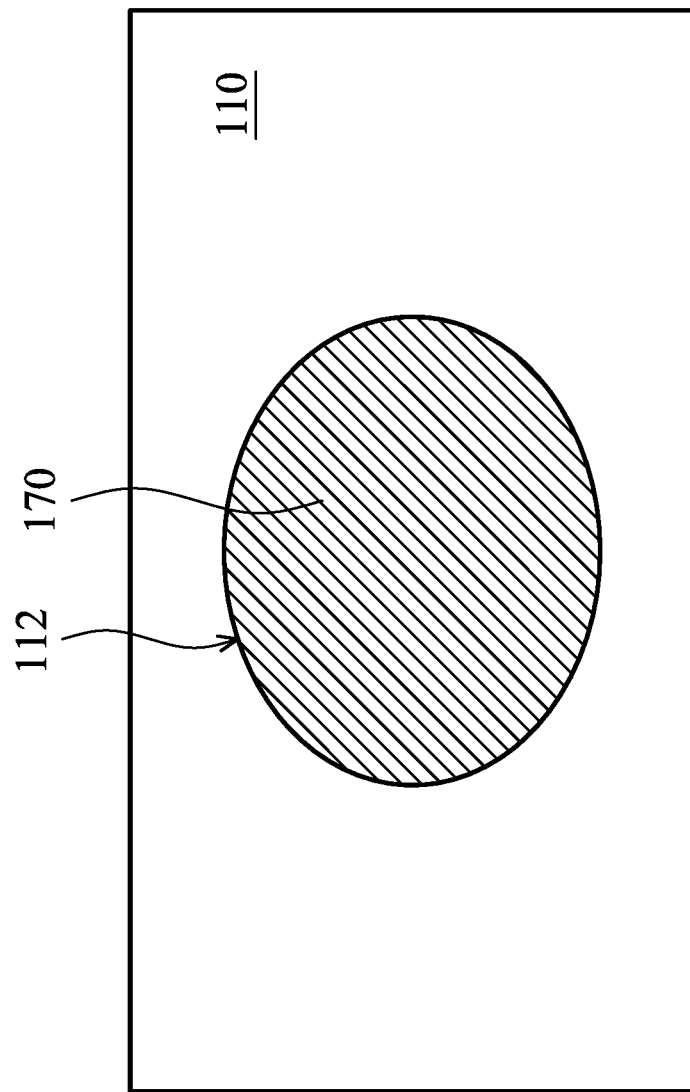
Figures 1, 3G:
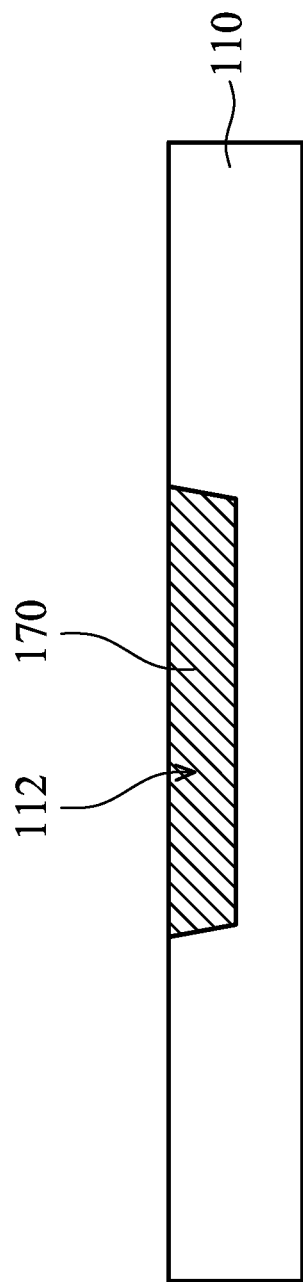
Figures 2, 3G:
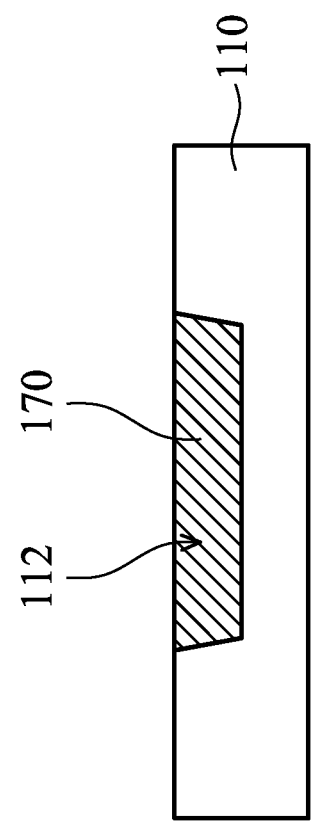

FIGS. 3A-3G are top views of various stages of a process for forming a semiconductor device structure, in accordance with some embodiments. FIGS. 3A-1 to 3G-1 are cross-sectional views illustrating the semiconductor device structure along a sectional line I-I' in FIGS. 3A-3G, in accordance with some embodiments. FIGS. 3A-2 to 3G-2 are cross-sectional views illustrating the semiconductor device structure along a sectional line II-II' in FIGS. 3A-3G, in accordance with some embodiments.

As shown in FIGS. 3A, 3A-1, and 3A-2, the step of FIG. 1A is performed to form the layer 110, the mask layer 120, the antireflection layer 130, and the mask layer 140, in accordance with some embodiments. As shown in FIGS. 3A, 3A-1, and 3A-2, a recess 147 is formed in the mask layer 140, in accordance with some embodiments. The recess 147 exposes a portion of the antireflection layer 130, in accordance with some embodiments. The recess 147 has a substantially oval shape, in accordance with some embodiments. The recess 147 has inner walls 147a, 147b, 147c, and 147d, in accordance with some embodiments.

The inner walls 147a and 147b are opposite to each other, in accordance with some embodiments. The inner walls 147a and 147b are spaced apart by a distance D1, in accordance with some embodiments. The inner walls 147c and 147d are opposite to each other, in accordance with some embodiments. The inner walls 147c and 147d are spaced apart by a distance D2, in accordance with some embodiments. The distance D2 is less than the distance D1, in accordance with some embodiments.

As shown in FIGS. 3A, 3A-1, and 3A-2, a covering layer 310 is deposited over the mask layer 140 and the antireflection layer 130 and is deposited in the recess 147, in accordance with some embodiments. The covering layer 310 conformally covers the inner walls 147a, 147b, 147c and 147d and a bottom surface 147e of the recess 147, in accordance with some embodiments. The covering layer 310 has a recess 312 in the recess 147, in accordance with some embodiments. The recess 312 has a substantially oval shape, in accordance with some embodiments.

The deposition process of the covering layer 310 uses a vapor deposition material, in accordance with some embodiments. The vapor deposition material is more easily deposited into a wide space (e.g., the space between the inner walls 147a and 147b) than a narrow space (e.g., the space between the inner walls 147c and 147d), in accordance with some embodiments. Therefore, the covering layer 310 over the inner walls 147c and 147d is thinner than the covering layer 310 over the inner walls 147a and 147b, in accordance with some embodiments.

The covering layer 310 is made of a polymer material, oxides (e.g., silicon oxides), nitride, or another suitable material, in accordance with some embodiments. In some embodiments, the covering layer 310 and the mask layer 140 are made of different materials. In some other embodiments, the covering layer 310 and the mask layer 140 are made of the same material.

The covering layer 310 is formed using a physical vapor deposition process, in accordance with some embodiments. The physical vapor deposition process includes a plasma deposition process, in accordance with some embodiments. A deposition gas used by the plasma deposition process includes $CHF_3$, $C_4F_6$, or another suitable gas, in accordance with some embodiments. The plasma deposition process is performed at a pressure ranging from about 60 mT to about 200 mT, in accordance with some embodiments.

As shown in FIGS. 3B, 3B-1, and 3B-2, the covering layer 310 is thinned using an etching process, in accordance with some embodiments. The etching process includes an anisotropic etching process, in accordance with some embodiments. In the etching process, the etching rate of the covering layer 310 over the substantially horizontal surfaces (e.g., a top surface 314 of the covering layer 310 and the bottom surface 147e of the recess 147) is greater than the etching rate of the covering layer 310 over the substantially vertical surfaces (e.g., the inner walls 147a, 147b, 147c and 147d), in accordance with some embodiments. Therefore, the covering layer 310 covering the bottom surface 147e is removed, in accordance with some embodiments. After the removal of the covering layer 310 covering the bottom surface 147e, the recess 312 passes through the covering layer 310, in accordance with some embodiments.

Since the covering layer 310 over the inner walls 147c and 147d is thinner than the covering layer 310 over the inner walls 147a and 147b (as shown in FIGS. 3A, 3A-1, and 3A-2), the covering layer 310 over the inner walls 147c and 147d is removed after the etching process (as shown in FIGS. 3B, 3B-1, and 3B-2), in accordance with some embodiments. After the covering layer 310 over the inner walls 147c and 147d is removed, a portion of the mask layer 140 is removed from the inner walls 147c and 147d by the etching process, in accordance with some embodiments. As shown in FIGS. 3B and 3B-2, a distance D2' between the inner walls 147c and 147d is greater than the distance D2 between the inner walls 147c and 147d of FIG. 3A-2, in accordance with some embodiments.

The anisotropic etching process includes a dry etching process (e.g., a plasma etching process), in accordance with some embodiments. In some embodiments, the covering layer 310 is formed using a plasma deposition process and the covering layer 310 is thinned using a plasma etching process. The covering layer 310 is formed and thinned in the same plasma chamber, in accordance with some embodiments.

As shown in FIGS. 3C, 3C-1, and 3C-2, a covering layer 320 is deposited over the covering layer 310 and the antireflection layer 130 and is deposited in the recess 147, in accordance with some embodiments. The covering layer 320 conformally covers the covering layer 310, the inner walls 147c and 147d, and the bottom surface 147e of the recess 147, in accordance with some embodiments. The covering layer 320 has a recess 322 in the recess 147, in accordance with some embodiments. The recess 322 has a substantially oval shape, in accordance with some embodiments. The covering layer 320 over the inner walls 147c and 147d is thinner than the covering layer 320 over the inner walls 147a and 147b, in accordance with some embodiments.

The covering layer 320 is made of a polymer material, oxides (e.g., silicon oxides), nitride, or another suitable material. In some embodiments, the covering layer 320 and the mask layer 140 are made of different materials. In some other embodiments, the covering layer 320 and the mask layer 140 are made of the same material. In some embodiments, the covering layers 310 and 320 are made of the same material. In some other embodiments, the covering layers 310 and 320 are made of different materials.

The covering layer 320 is formed using a physical vapor deposition process, in accordance with some embodiments. The physical vapor deposition process includes a plasma deposition process, in accordance with some embodiments. A deposition gas used by the plasma deposition process includes $CHF_3$, $C_4F_6$, or another suitable gas, in accordance with some embodiments. The plasma deposition process is performed at a pressure ranging from about 60 mT to about 200 mT, in accordance with some embodiments.

As shown in FIGS. 3D, 3D-1, and 3D-2, the covering layer 320 is thinned using an etching process, in accordance with some embodiments. The etching process includes an anisotropic etching process, in accordance with some embodiments. The covering layer 320 covering the bottom surface 147e and the inner walls 147c and 147d is removed, in accordance with some embodiments.

After the removal of the covering layer 320 covering the bottom surface 147e, the recess 322 passes through the covering layer 320, in accordance with some embodiments. As shown in FIGS. 3D, 3D-1, and 3D-2, a thickness T11 of the covering layer 310 is substantially equal to a thickness T12 of the covering layer 320 over the inner wall 147a or 147b, in accordance with some embodiments.

After the covering layer 320 over the inner walls 147c and 147d is removed, a portion of the mask layer 140 is removed from the inner walls 147c and 147d by the etching process, in accordance with some embodiments. As shown in FIGS. 3D and 3D-2, a distance D2" between the inner walls 147c and 147d is greater than the distance D2' between the inner walls 147c and 147d of FIG. 3B-2, in accordance with some embodiments.

The anisotropic etching process includes a dry etching process (e.g., a plasma etching process), in accordance with some embodiments. In some embodiments, the covering layer 320 is formed using a plasma deposition process and the covering layer 320 is thinned using a plasma etching process. The covering layer 320 is formed and thinned in the same plasma chamber, in accordance with some embodiments.

As shown in FIGS. 3E, 3E-1, and 3E-2, the steps of FIGS. 3C and 3D are performed again to form a covering layer 330 over the covering layer 320, in accordance with some embodiments. The covering layer 330 has sidewalls 332a and 332b opposite to each other, in accordance with some embodiments. A distance D3 between the sidewalls 332a and 332b is less than the distance D1 between the inner walls 147a and 147b, in accordance with some embodiments.

As shown in FIGS. 3E and 3E-2, a distance D2''' between the inner walls 147c and 147d is greater than the distance D2'' between the inner walls 147c and 147d of FIG. 3D-2, in accordance with some embodiments. In some embodiments, a ratio of the distance D3 to the distance D2' ranges from about 1.1 to 1.3. For example, the ratio (D3/D2''') is about 1.2. The sidewalls 332a and 332b and the inner walls 147c and 147d together define a hole A, in accordance with some embodiments. The hole A has a substantially oval shape, which is rounder than that of the recess 147 of FIG. 3A, in accordance with some embodiments.

As shown in FIGS. 3F, 3F-1, and 3F-2, the portions of the mask layer 120 and the antireflection layer 130 are removed through the hole A to form a through hole TH3 passing through the mask layer 120 and the antireflection layer 130, in accordance with some embodiments. The through hole TH3 is under the hole A, in accordance with some embodiments.

As shown in FIGS. 3G, 3G-1, and 3G-2, the mask layer 140 and the covering layers 310, 320 and 330 are removed, in accordance with some embodiments. The removal process includes an etching process, such as a wet etching process or a dry etching process, in accordance with some embodiments. As shown in FIGS. 3G, 3G-1, and 3G-2, a portion of the layer 110 is removed through the through hole TH3 of FIGS. 3F, 3F-1, and 3F-2 to form a recess 112 in the layer 110, in accordance with some embodiments.

As shown in FIGS. 3G, 3G-1, and 3G-2, the mask layer 120 and the antireflection layer 130 are removed, in accordance with some embodiments. The removal process includes an etching process, such as a wet etching process or a dry etching process, in accordance with some embodiments. As shown in FIGS. 3G, 3G-1, and 3G-2, a structure 170 is formed in the recess 112, in accordance with some embodiments. The structure 170 includes a conductive structure (e.g., a contact plug, a conductive line, or a conductive via), an insulating structure, or a semiconductor structure, in accordance with some embodiments. The structure 170 is made of metal, alloy, oxides (e.g., silicon dioxide), nitrides, or another suitable material, in accordance with some embodiments.

Figure 4A:
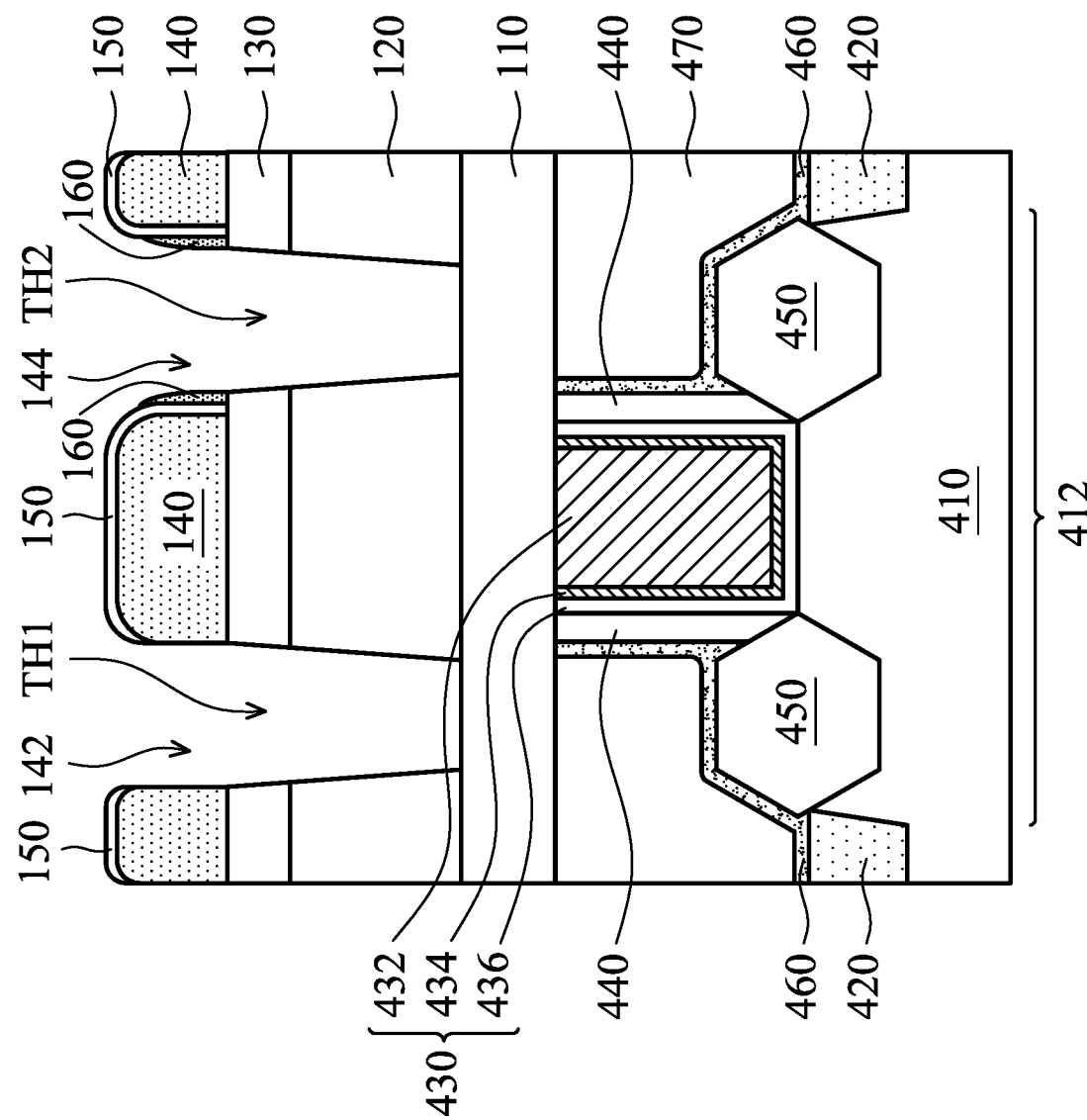
FIGS. 4A-4C are cross-sectional views of various stages of a process for forming a semiconductor device structure, in accordance with some embodiments.
Figure 4B:
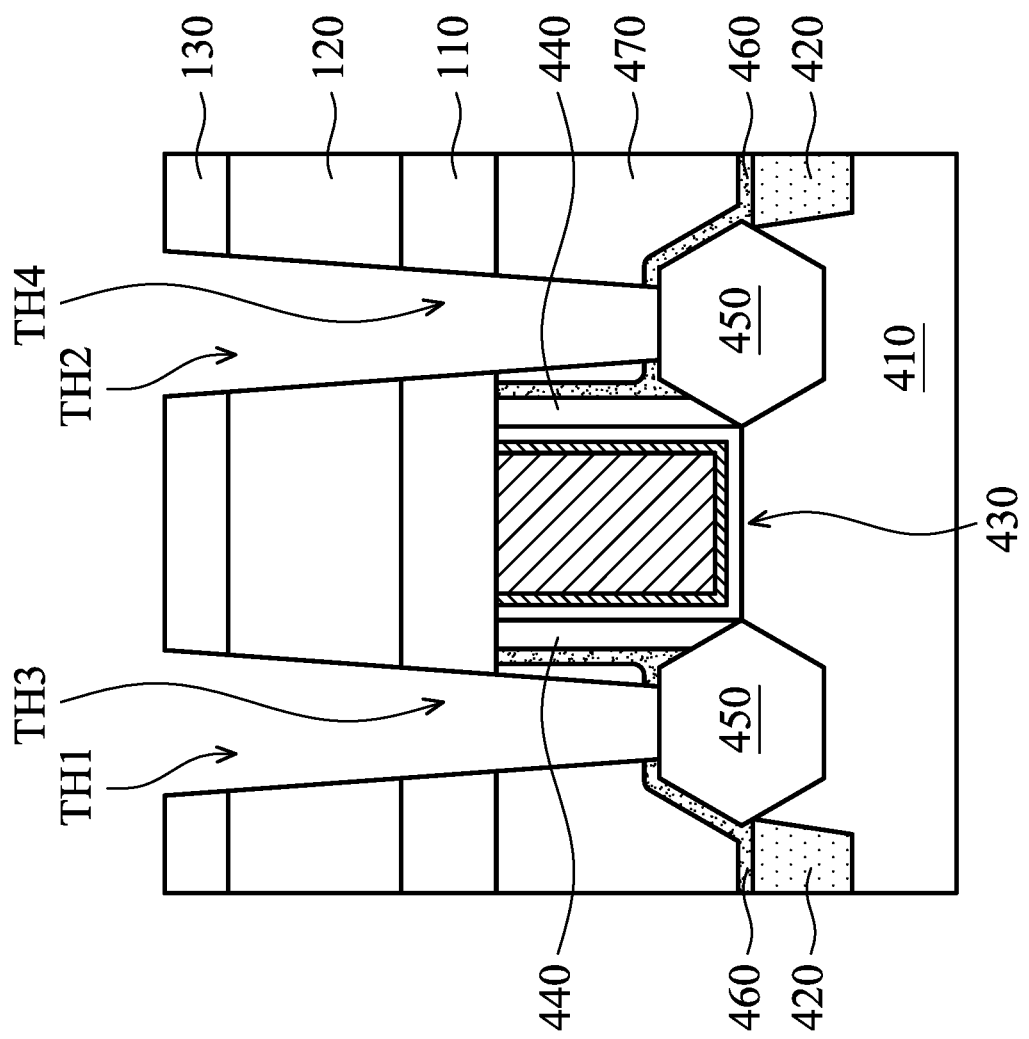
Figure 4C:
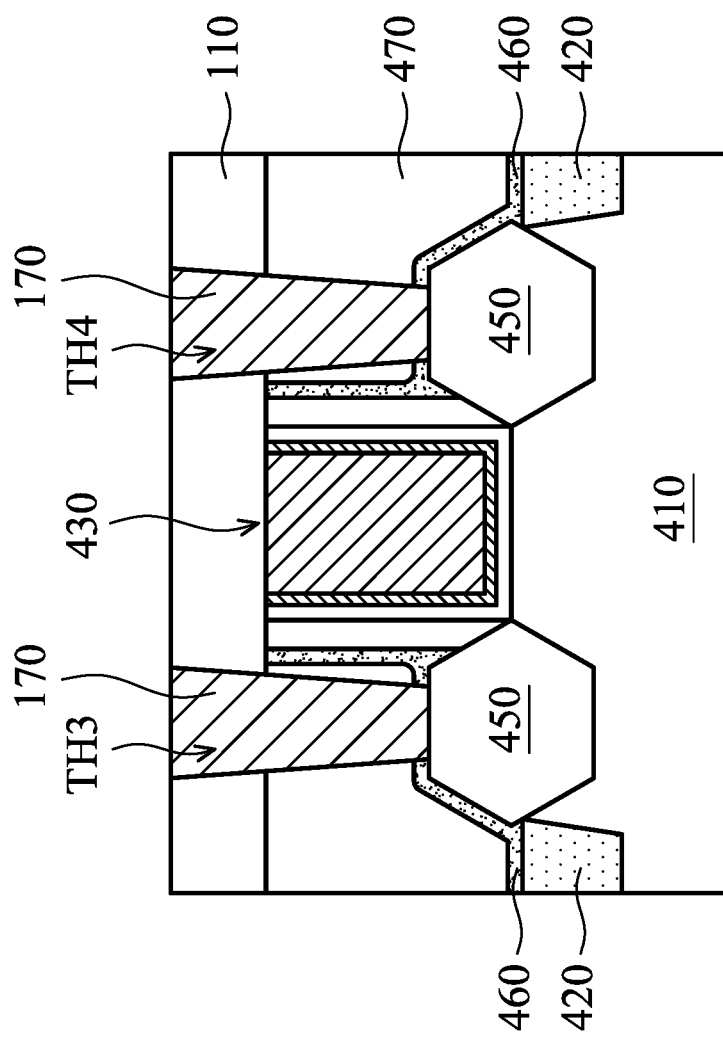

FIGS. 4A-4C are cross-sectional views of various stages of a process for forming a semiconductor device structure, in accordance with some embodiments. As shown in FIG. 4A, a substrate 410, an insulating layer 420, a gate stack 430, a spacer layer 440, source/drain structures 450, an etch stop layer 460, and a dielectric layer 470 are provided, in accordance with some embodiments.

In some embodiments, the substrate 410 is a bulk semiconductor substrate, such as a semiconductor wafer. For example, the substrate 410 is a silicon wafer. The substrate 410 may include silicon or another elementary semiconductor material such as germanium. In some other embodiments, the substrate 410 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 410 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof. In some embodiments, various device elements are formed in and/or over the substrate 410. The device elements are not shown in figures for the purpose of simplicity and clarity.

The insulating layer 420 is formed in the substrate 410 to surround active regions 412 of the substrate 410, in accordance with some embodiments. For the sake of simplicity, FIG. 4A only shows one of the active regions 412, in accordance with some embodiments. The insulating layer 420 is made of oxide (such as silicon dioxide), in accordance with some embodiments.

The gate stack 430 is formed over the active region 412 of the substrate 410, in accordance with some embodiments. The spacer layer 440 surrounds the gate stack 430, in accordance with some embodiments. The gate stack 430 includes a gate electrode layer 432, a work function layer 434, and a gate dielectric layer 436, in accordance with some embodiments. The work function layer 434 surrounds the gate electrode layer 432 and is positioned between the gate electrode layer 432 and the substrate 410, in accordance with some embodiments. The gate dielectric layer 436 is between the work function layer 434 and the substrate 410 and between the work function layer 434 and the spacer layer 440, in accordance with some embodiments.

The gate electrode layer 432 is made of a suitable metal material, such as aluminum, tungsten, gold, platinum, cobalt, an alloy thereof, or a combination thereof, in accordance with some embodiments. The work function layer 434 provides a desired work function for a transistor to enhance device performance including improved threshold voltage.

In the embodiments of forming an N-type fin field effect transistor (FinFET), the work function layer 434 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a P-type FinFET, the work function layer 434 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments. For example, the p-type metal is made of titanium, titanium nitride, other suitable materials, or a combination thereof.

The gate dielectric layer 436 includes a dielectric material, such as a high dielectric constant (high-k) material. The high-k material includes hafnium dioxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments. The spacer layer 440 includes an insulating material, such as silicon dioxide or silicon nitride, in accordance with some embodiments.

The source/drain structures 450 are formed in the substrate 410 and are positioned on opposite sides of the gate stack 430, in accordance with some embodiments. The gate stack 430 and the source/drain structures 450 together form a transistor, in accordance with some embodiments. The source/drain structures 450 are used to be a source structure and a drain structure of a transistor, in accordance with some embodiments.

The source/drain structures 450 are also used to be stressors, in accordance with some embodiments. In some embodiments, the source/drain structures 450 apply a compressive stress to a channel region of the substrate 410 under the gate stack 430, and the source/drain structures 450 include SiGe or another suitable material. Alternatively, in some other embodiments, the source/drain structures 450 apply a tensile stress to a channel region of the substrate 410 under the gate stack 430, and the source/drain structures 450 include SiC or another suitable material.

The etch stop layer 460 is formed over the source/drain structures 450, the insulating layer 420, and the spacer layer 440, in accordance with some embodiments. The etch stop layer 460 is made of a dielectric material, in accordance with some embodiments. The etch stop layer 460 includes silicon nitride, in accordance with some embodiments.

The dielectric layer 470 is formed over the etch stop layer 460, in accordance with some embodiments. The dielectric layer 470 is made of silicon dioxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

As shown in FIG. 4A, the steps of FIGS. 1A-1E are performed, in accordance with some embodiments. The layer 110 is formed over the gate stack 430, the spacer layer 440, the etch stop layer 460, and the dielectric layer 470, in accordance with some embodiments. The layer 110 is made of silicon dioxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The layer 110 and the dielectric layer 470 are made of the same material, in accordance with some embodiments. The through holes TH1 and TH2 are respectively over the source/drain structures 450, in accordance with some embodiments.

As shown in FIG. 4B, the mask layer 140 and the covering layers 150 and 160 are removed, in accordance with some embodiments. The removal process includes an etching process, such as a wet etching process or a dry etching process, in accordance with some embodiments. As shown in FIG. 4B, portions of the layer 110, the dielectric layer 470, and the etch stop layer 460 are removed through the through holes TH1 and TH2 to form through holes TH3 and TH4 passing through the layer 110, the dielectric layer 470, and the etch stop layer 460, in accordance with some embodiments. The through holes TH3 and TH4 are respectively under the through holes TH1 and TH2, in accordance with some embodiments.

As shown in FIG. 4C, the mask layer 120 and the antireflection layer 130 are removed, in accordance with some embodiments. The removal process includes an etching process, such as a wet etching process or a dry etching process, in accordance with some embodiments. As shown in FIG. 4C, conductive structures 170 are formed in the through holes TH3 and TH4, in accordance with some embodiments. The conductive structures 170 include contact plugs, in accordance with some embodiments. The conductive structures 170 are electrically connected to the source/drain structures 450 thereunder, in accordance with some embodiments. The conductive structures 170 are made of metal (e.g., W, Cu or Al), alloy, or another suitable conductive material, in accordance with some embodiments.

Figure 5A:
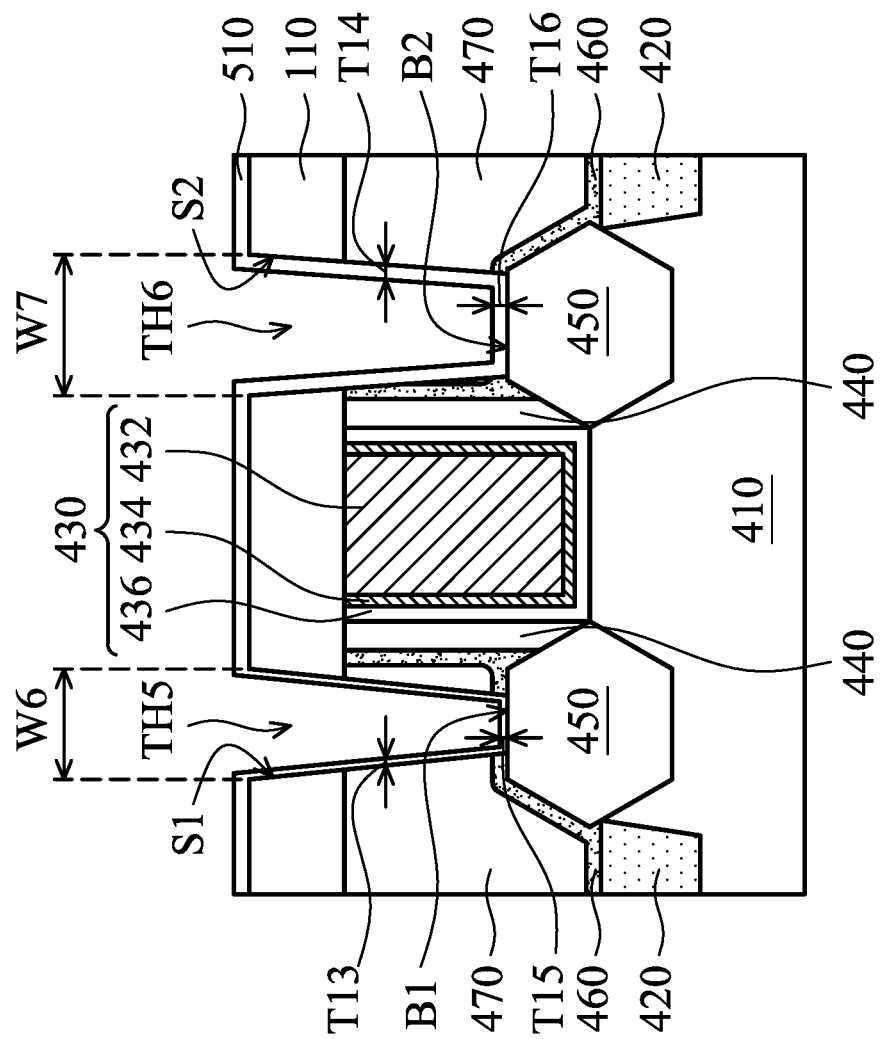
FIGS. 5A-5C are cross-sectional views of various stages of a process for forming a semiconductor device structure, in accordance with some embodiments.
Figure 5B:
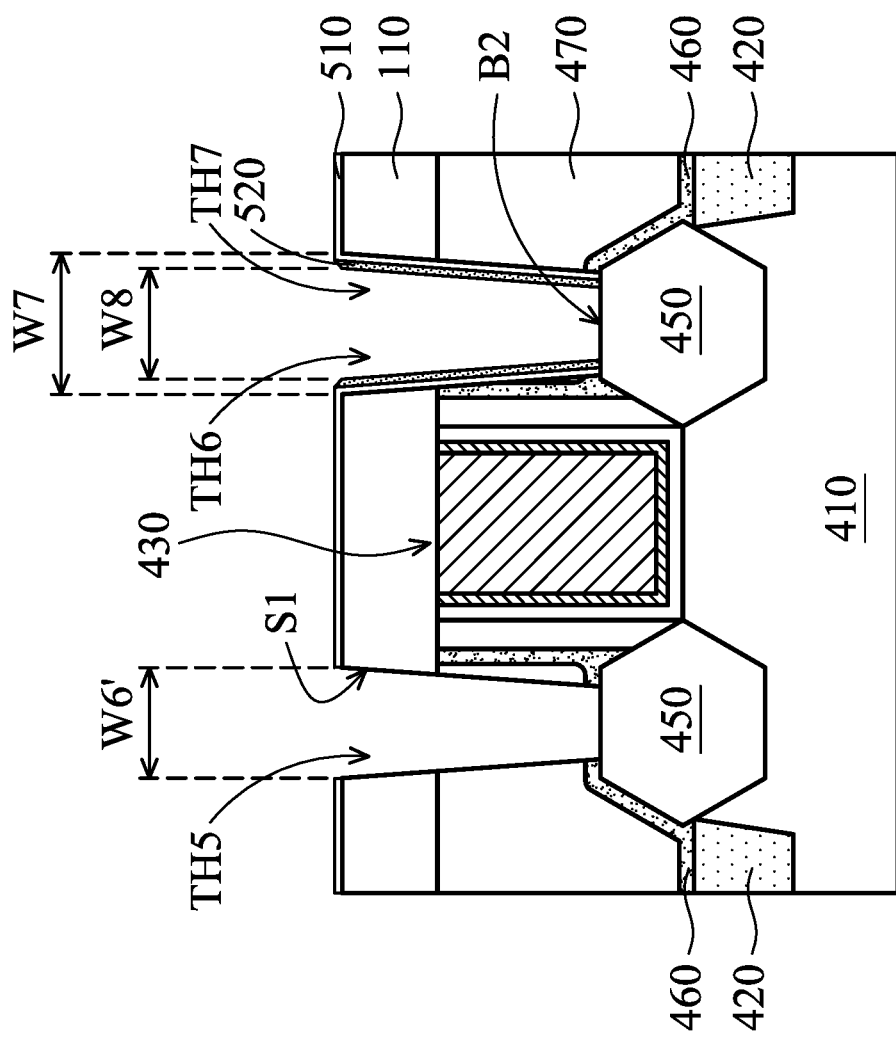
Figure 5C:
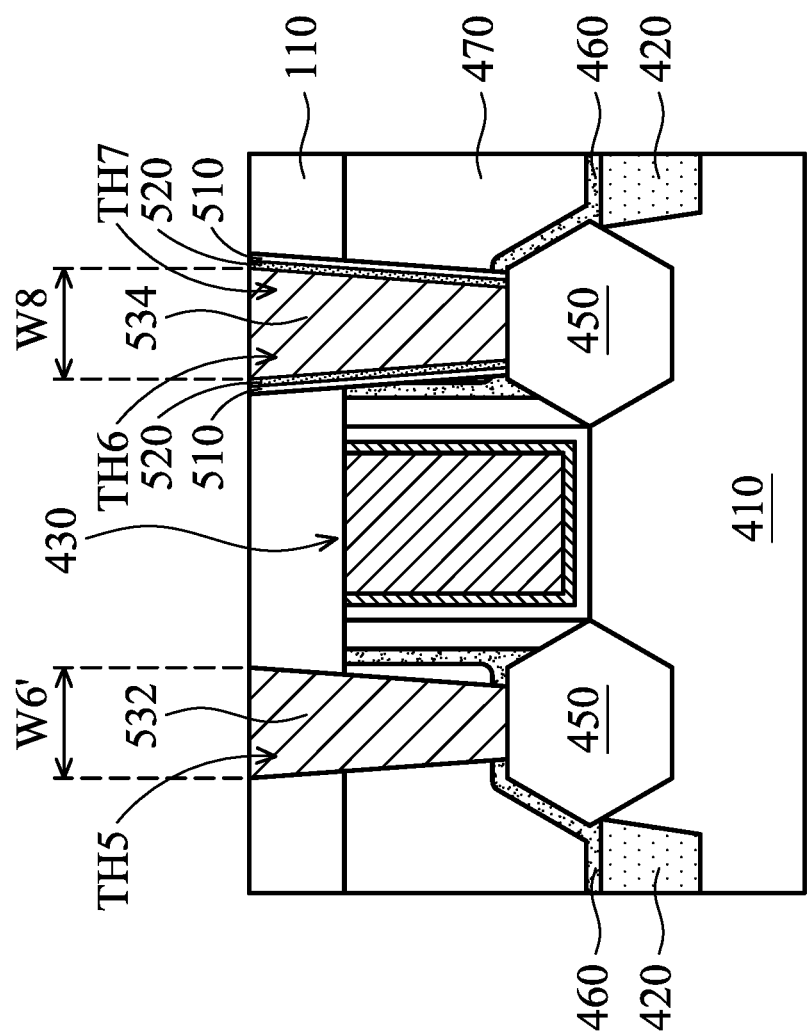

FIGS. 5A-5C are cross-sectional views of various stages of a process for forming a semiconductor device structure, in accordance with some embodiments. As shown in FIG. 5A, the substrate 410, the insulating layer 420, the gate stack 430, the spacer layer 440, the source/drain structures 450, the etch stop layer 460, the dielectric layer 470, and the layer 110 of FIG. 4A are provided, in accordance with some embodiments.

As shown in FIG. 5A, portions of the layer 110, the dielectric layer 470, and the etch stop layer 460 are removed to form through holes TH5 and TH6 in the layer 110, the dielectric layer 470, and the etch stop layer 460, in accordance with some embodiments. The through hole TH5 is narrower than the through hole TH6, in accordance with some embodiments. That is, a width W6 of the through hole TH5 is less than a width W7 of the through hole TH6, in accordance with some embodiments.

As shown in FIG. 5A, a covering layer 510 is formed over the layer 110 and in the through holes TH5 and TH6, in accordance with some embodiments. Since the through hole TH5 is narrower than the through hole TH6, the covering layer 510 in the through hole TH5 is thinner than the covering layer 510 in the through hole TH6, in accordance with some embodiments.

The thickness T13 of the covering layer 510 covering the inner walls S1 of the through hole TH5 is less than the thickness T14 of the covering layer 510 covering the inner walls S2 of the through hole TH6, in accordance with some embodiments. The thickness T15 of the covering layer 510 covering the bottom surface B1 of the through hole TH5 is less than the thickness T16 of the covering layer 510 covering the bottom surface B2 of the through hole TH6, in accordance with some embodiments.

The covering layer 510 is used as a barrier layer, which is used to prevent metal materials of a contact layer subsequently formed in the through hole TH6 from diffusing into the layer 110 and the dielectric layer 470, in accordance with some embodiments.

The covering layer 510 is made of a metal-containing material or an insulating material, in accordance with some embodiments. The metal-containing material includes titanium, titanium nitride, cobalt, cobalt nitride, ruthenium, ruthenium nitride, a combination thereof, or another suitable material, in accordance with some embodiments.

The covering layer 510 is formed using a deposition process, such as a chemical vapor deposition process or a physical vapor deposition process, in accordance with some embodiments. The physical vapor deposition process includes a plasma deposition process, in accordance with some embodiments.

As shown in FIG. 5B, the covering layer 510 is thinned using an etching process, in accordance with some embodiments. The etching process includes an anisotropic etching process, in accordance with some embodiments. The etching process removes the covering layer 510 in the through hole TH5 and the covering layer 510 covering the bottom surface B2 of the through hole TH6, in accordance with some embodiments. The etching process further removes the layer 110 and the dielectric layer 470 from the inner walls S1 of the through hole TH5, and therefore the through hole TH5 is widened, in accordance with some embodiments.

As shown in FIG. 5B, the steps of FIGS. 5A-5B for forming and thinning the covering layer 510 are performed again to form a covering layer 520 over the covering layer 510 in the through hole TH6, in accordance with some embodiments. In some embodiments, the covering layers 510 and 520 are made of the same material. In some other embodiments, the covering layers 510 and 520 are made of different materials. The covering layer 520 includes a metal-containing material or an insulating material, in accordance with some embodiments. The metal-containing material includes titanium, titanium nitride, cobalt, cobalt nitride, ruthenium, ruthenium nitride, a combination thereof, or another suitable material, in accordance with some embodiments.

The width W6' of the through hole TH5 of FIG. 5B is greater than the width W6 of the through hole TH5 of FIG. 5A, in accordance with some embodiments. The covering layer 520 has a through hole TH7 in the through hole TH6, in accordance with some embodiments. A width W8 of the through hole TH7 is less than the width W7 of the through hole TH6, in accordance with some embodiments. Therefore, the difference between the widths W6' and W8 is less than the difference between the widths W6 and W7 (as shown in FIG. 5A), in accordance with some embodiments.

As a result, the formation of the covering layers 510 and 520 is able to improve the width uniformity of contact plugs subsequently formed in the through holes TH5 and TH7 and therefore the yield of the contact plugs are improved as well, in accordance with some embodiments. The width W8 is greater than the width W6', in accordance with some embodiments. In some embodiments, a ratio of the width W8 to the width W6' ranges from about 1.1 to 1.3. For example, the ratio (W8/W6') is about 1.2.

Thereafter, a conductive layer (not shown) is formed over the covering layer 510 and in the through holes TH5 and TH7, in accordance with some embodiments. Then, the conductive layer and the covering layers 510 and 520 outside of the through holes TH5 and TH6 are removed, in accordance with some embodiments. As shown in FIG. 5C, the conductive layer remaining in the through holes TH5 and TH6 forms contact plugs 532 and 534, in accordance with some embodiments. The contact plugs 532 and 534 are electrically connected to the source/drain structures 450 thereunder, in accordance with some embodiments. The covering layers 510 and 520 separate the contact plug 534 from the layer 110 and the dielectric layer 470, in accordance with some embodiments. The contact plugs 532 and 534 are made of a conductive material, such as metal (e.g., W, Cu or Al) or alloy, in accordance with some embodiments.

In accordance with some embodiments, methods for forming semiconductor device structures are provided. The methods (for forming the semiconductor device structure) form a covering layer in a narrow recess and a wide recess of a layer, and the covering layer in the narrow recess is thinner than the covering layer in the wide recess. The methods thin the covering layer to remove the covering layer in the narrow recess and the covering layer covering a bottom surface of the wide recess. The covering layer remaining over inner walls of the wide recess has an opening narrower than the wide recess. The methods remove the layer from inner walls of the narrow recess to widen the narrow recess. Therefore, the width difference between the opening and the narrow recess, which is widened, is less than the width difference between the narrow recess and the wide recess. As a result, the methods improve critical dimension uniformity (e.g., widths).

In accordance with some embodiments, a method for forming a semiconductor device structure is provided. The method includes forming a recess in a layer. The recess has two opposite first inner walls and two opposite second inner walls, the first inner walls are spaced apart by a first distance, the second inner walls are spaced apart by a second distance, and the first distance is less than the second distance. The method includes depositing a first covering layer in the recess. The first covering layer covering the first inner walls is thinner than the first covering layer covering the second inner walls. The method includes removing the first covering layer over the first inner walls and a bottom surface of the recess.

In accordance with some embodiments, a method for forming a semiconductor device structure is provided. The method includes forming a recess in a layer. The recess has two opposite first inner walls and two opposite second inner walls, the second inner walls are between the first inner walls, the first inner walls are spaced apart by a first distance, the second inner walls are spaced apart by a second distance, and the first distance is less than the second distance. The method includes depositing a covering layer in the recess. The covering layer covering the first inner walls is thinner than the covering layer covering the second inner walls. The method includes thinning the covering layer. The covering layer over the first inner walls is removed and the first inner walls are exposed.

In accordance with some embodiments, a method for forming a semiconductor device structure is provided. The method includes forming a recess in a layer. The recess has two opposite first curved walls and two opposite second curved walls, the first curved walls are connected to the second curved walls, the first curved walls are spaced apart by a first maximum distance, the second curved walls are spaced apart by a second maximum distance, and the first maximum distance is less than the second maximum distance. The method includes depositing a covering layer in the recess. The covering layer covering the first curved walls is thinner than the covering layer covering the second curved walls. The method includes removing the covering layer over the first curved walls to expose the first curved walls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a recess in a layer, wherein the recess has two opposite first inner walls and two opposite second inner walls, the first inner walls are spaced apart by a first distance, the second inner walls are spaced apart by a second distance, and the first distance is less than the second distance;
   depositing a first covering layer in the recess, wherein the first covering layer covering the first inner walls is thinner than the first covering layer covering the second inner walls; and
   removing the first covering layer over the first inner walls and a bottom surface of the recess.

2. The method for forming the semiconductor device structure as claimed in claim 1, further comprising:
   forming a second covering layer in the recess after removing the first covering layer over the first inner walls and the bottom surface, wherein the second covering layer over the first inner walls is thinner than the second covering layer over the second inner walls, and the second covering layer covers the first covering layer and the bottom surface; and
   removing the second covering layer over the first inner walls and the bottom surface.

3. The method for forming the semiconductor device structure as claimed in claim 2, wherein the first covering layer and the second covering layer are made of a same material.

4. The method for forming the semiconductor device structure as claimed in claim 2, wherein a first thickness of the first covering layer is substantially equal to a second thickness of the second covering layer after removing the second covering layer over the first inner walls and the bottom surface.

5. The method for forming the semiconductor device structure as claimed in claim 1, wherein the first covering layer and the layer are made of different materials.

6. The method for forming the semiconductor device structure as claimed in claim 1, wherein the first covering layer further covers a top surface of the layer after removing the first covering layer over the first inner walls and the bottom surface of the recess.

7. The method for forming the semiconductor device structure as claimed in claim 6, wherein the first covering layer covering the top surface is thinner than the first covering layer covering the second inner walls after removing the first covering layer over the first inner walls and the bottom surface of the recess.

8. The method for forming the semiconductor device structure as claimed in claim 1, wherein the recess has a substantially oval shape.

9. The method for forming the semiconductor device structure as claimed in claim 1, wherein after removing the first covering layer over the first inner walls and the bottom surface of the recess, the first covering layer remaining over the second inner walls has a curved sidewall.

10. The method for forming the semiconductor device structure as claimed in claim 9, wherein the first covering layer remaining over the second inner walls has a thickness decreasing toward the first inner walls.

11. A method for forming a semiconductor device structure, comprising:
    forming a recess in a layer, wherein the recess has two opposite first inner walls and two opposite second inner walls, the second inner walls are between the first inner walls, the first inner walls are spaced apart by a first distance, the second inner walls are spaced apart by a second distance, and the first distance is less than the second distance;
    depositing a covering layer in the recess, wherein the covering layer covering the first inner walls is thinner than the covering layer covering the second inner walls; and
    thinning the covering layer, wherein the covering layer over the first inner walls is removed and the first inner walls are exposed.

12. The method for forming the semiconductor device structure as claimed in claim 11, wherein the thinning of the covering layer further removes the covering layer over a bottom surface of the recess.

13. The method for forming the semiconductor device structure as claimed in claim 11, wherein the thinning of the covering layer comprises:
    performing an anisotropic etching process over the covering layer.

14. The method for forming the semiconductor device structure as claimed in claim 11, wherein the covering layer and the layer are made of different materials.

15. The method for forming the semiconductor device structure as claimed in claim 11, wherein the layer is thicker than the covering layer.

16. A method for forming a semiconductor device structure, comprising:
    forming a recess in a layer, wherein the recess has two opposite first curved walls and two opposite second curved walls, the first curved walls are connected to the second curved walls, the first curved walls are spaced apart by a first maximum distance, the second curved walls are spaced apart by a second maximum distance, and the first maximum distance is less than the second maximum distance;
    depositing a covering layer in the recess, wherein the covering layer covering the first curved walls is thinner than the covering layer covering the second curved walls; and
    removing the covering layer over the first curved walls to expose the first curved walls.

17. The method for forming the semiconductor device structure as claimed in claim 16, wherein the first curved walls are connected between the second curved walls.

18. The method for forming the semiconductor device structure as claimed in claim 16, wherein after removing the covering layer over the first curved walls, the covering layer remaining over the second curved walls has a thickness decreasing toward the first curved walls.

19. The method for forming the semiconductor device structure as claimed in claim 18, wherein the thickness continuously decreases toward the first curved walls.

20. The method for forming the semiconductor device structure as claimed in claim 16, wherein the covering layer and the layer are made of different materials.

* * * * *